United States Patent
Nakano

(10) Patent No.: US 10,555,409 B2
(45) Date of Patent: Feb. 4, 2020

(54) TARGET SUPPLY APPARATUS

(71) Applicant: Gigaphoton Inc., Tochigi (JP)

(72) Inventor: Masaki Nakano, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/293,741

(22) Filed: Mar. 6, 2019

(65) Prior Publication Data

US 2019/0200443 A1 Jun. 27, 2019

Related U.S. Application Data

(63) Continuation of application No. PCT/JP2016/080142, filed on Oct. 11, 2016.

(51) Int. Cl.
*H05G 2/00* (2006.01)
*G03F 7/20* (2006.01)
*H02N 2/00* (2006.01)

(52) U.S. Cl.
CPC ......... *H05G 2/008* (2013.01); *G03F 7/70033* (2013.01); *G03F 7/70166* (2013.01); *H02N 2/001* (2013.01)

(58) Field of Classification Search
CPC .......... H05G 2/00; H05G 2/001; H05G 2/003; H05G 2/005; H05G 2/006; H05G 2/008
USPC .................................................... 250/504 R
See application file for complete search history.

(56) References Cited

U.S. PATENT DOCUMENTS

| 2006/0176925 A1* | 8/2006 | Nakano ................. H05G 2/003 372/69 |
| 2012/0286176 A1 | 11/2012 | Rajyaguru et al. |
| 2014/0160450 A1* | 6/2014 | Loopstra ................ H05G 2/005 355/30 |
| 2016/0009077 A1 | 1/2016 | Watanabe |

FOREIGN PATENT DOCUMENTS

| JP | 2006-216801 A | 8/2006 |
| JP | 2009-190189 A | 8/2009 |
| JP | 2010-182555 A | 8/2010 |
| JP | 2014-519682 A | 8/2014 |

(Continued)

OTHER PUBLICATIONS

International Search Report issued in PCT/JP2016/080142; dated Dec. 27, 2016.

(Continued)

*Primary Examiner* — Jason L McCormack
(74) *Attorney, Agent, or Firm* — Studebaker & Brackett PC

(57) ABSTRACT

A target supply apparatus according to one aspect of the present disclosure includes a nozzle configured to output a target, a plurality of vibrators including a first vibrator configured to vibrate the nozzle, a detection unit configured to detect a change in state of the target having been output from the nozzle, a vibrator switching unit configured to perform switching of a vibrator that vibrates the nozzle from the first vibrator to the other vibrator that is included in the vibrators and is different from the first vibrator, and a control unit configured to control the switching of the vibrator that vibrates the nozzle, based on the change in state of the target having been output from the nozzle, detected by the detection unit.

19 Claims, 15 Drawing Sheets

(56) References Cited

FOREIGN PATENT DOCUMENTS

| JP | 2015-62202 A | 4/2015 |
|----|--------------|--------|
| JP | 2016-16618 A | 2/2016 |

OTHER PUBLICATIONS

Notification of Transmittal of Translation of the International Preliminary Report on Patentability (Chapter I) and Translation of Written Opinion of the International Searching Authority; PCT/JP2016/080142; dated Apr. 16, 2019.

* cited by examiner

TARGET SUPPLY APPARATUS

CROSS-REFERENCE TO RELATED APPLICATIONS

The present application is a continuation application of International Application No. PCT/JP2016/0801412 filed on Oct. 11, 2016. The content of the application is incorporated herein by reference in its entirety.

BACKGROUND

1. Technical Field

The present disclosure relates to a target supply apparatus.

2. Related Art

In recent years, along with microfabrication in the semiconductor manufacturing process, fine transfer patterns in photolithography of the semiconductor manufacturing process have been developed rapidly. In the next generation, microfabrication of 20 nm or smaller will be required. Accordingly, it is expected to develop an exposure device in which a device for generating extreme ultraviolet (EUV) light having a wavelength of about 13 nm and a reflection reduction projection optical system are combined.

As EUV light generation devices, three types of devices are proposed, namely, a laser produced plasma (LPP) type device that uses plasma generated when a target material is irradiated with laser light, a discharge produced plasma (DPP) type device that uses plasma generated by discharging, and a synchrotron radiation (SR) type device that uses orbital radiation light.

CITATION LIST

Patent Literature

Patent Literature 1: Japanese Patent Application Laid-Open No. 2010-182555

Patent Literature 2: Japanese Patent Application Laid-Open No. 2006-216801

Patent Literature 3: Japanese Patent Application Laid-Open No. 2016-016618

Patent Literature 4: Japanese Patent Application Laid-Open No. 2009-190189

SUMMARY

A target supply apparatus according to one aspect of the present disclosure may include a nozzle, a plurality of vibrators, a detection unit, a vibrator switching unit, and a control unit. The nozzle may be configured to output a target. The vibrators may include a first vibrator configured to vibrate the nozzle. The detection unit may be configured to detect a change in state of the target having been output from the nozzle. The vibrator switching unit may be configured to perform switching of a vibrator that vibrates the nozzle from the first vibrator to the other vibrator that is included in the vibrators and is different from the first vibrator. The control unit may be configured to control the switching of the vibrator that vibrates the nozzle, based on the change in state of the target having been output from the nozzle, detected by the detection unit.

A target supply apparatus according to one aspect of the present disclosure may include a nozzle, a plurality of vibrators, a detection unit, a vibrator switching unit, and a control unit. The nozzle may be configured to output a target. The vibrators may include a second vibrator configured to vibrate the nozzle and a third vibrator configured to detect vibration of the nozzle. The detection unit may include the third vibrator, and may be configured to output a detection signal representing the vibration of the nozzle. The vibrator switching unit may be configured to perform switching of a vibrator that vibrates the nozzle from the second vibrator to the other vibrator that is included in the vibrators and is different from the second vibrator. The control unit may be configured to control the switching of the vibrator that vibrates the nozzle, based on the detection signal output from the detection unit.

A target supply apparatus according to one aspect of the present disclosure may include a nozzle, a plurality of vibrators, a detection unit, a vibrator switching unit, and a control unit. The nozzle may be configured to output a target. The vibrators may include a fourth vibrator configured to vibrate the nozzle. The detection unit may be configured to detect vibration of the nozzle and output a detection signal representing the vibration of the nozzle. The vibrator switching unit may be configured to perform switching of a vibrator that vibrates the nozzle from the fourth vibrator to the other vibrator that is included in the vibrators and is different from the fourth vibrator. The control unit may be configured to control the switching of the vibrator that vibrates the nozzle, based on the detection signal output from the detection unit.

A target supply apparatus according to one aspect of the present disclosure may include a nozzle, a plurality of vibrators, a detection unit, a vibrator switching unit, and a control unit. The nozzle may be configured to output a target. The vibrators may include a fifth vibrator configured to vibrate the nozzle. The detection unit may include at least one of a vibration number-of-times measuring unit configured to measure a vibration number-of-times of the fifth vibrator, and a vibration period measuring unit configured to measure a vibration period of the fifth vibrator. The vibrator switching unit may be configured to perform switching of a vibrator that vibrates the nozzle from the fifth vibrator to the other vibrator that is included in the vibrators and is different from the fifth vibrator. The control unit may be configured to allow the vibration switching unit to perform the switching of the vibrator that vibrates the nozzle from the fifth vibrator to the other vibrator different from the fifth vibrator, when the vibration number-of-times of the fifth vibrator measured by the vibration number-of-times measuring unit reaches a prescribed value of the vibration number-of-times that has been prescribed in advance, or when the vibration period of the fifth vibrator measured by the vibration period measuring unit reaches a prescribed value of the vibration period that has been prescribed in advance.

BRIEF DESCRIPTION OF THE DRAWINGS

Some embodiments of the present disclosure will be described below as just examples with reference to the accompanying drawings.

EMBODIMENTS

Contents
1. Overall Description of Extreme Ultraviolet Light Generation System
   1.1 Configuration
   1.2 Operation
2. Terms
3. Problem
4. Description of Extreme Ultraviolet Light Generation System including a Plurality of Vibrators in Target Supply Unit
   4.1 Configuration
   4.2 Operation
   4.3 Description of Target Position Measuring Sensor and Target Image Measuring Sensor
      4.3.1 Configuration
      4.3.2 Operation
5. First Embodiment
   5.1 Configuration
   5.2 Operation
      5.2.1 Overview
      5.2.2 Failure Determination when Target Detection Device is Timing Sensor
      5.2.3 Failure Determination when Target Detection Device is Target Image Measuring Sensor
   5.3 Procedure of Vibrator Switching Method
   5.4 Effect
6. Second Embodiment
   6.1 Configuration
   6.2 Operation
   6.3 Procedure of Vibrator Switching Method
   6.4 Effect
7. Third Embodiment
   7.1 Configuration
   7.2 Operation
   7.3 Procedure of Vibrator Switching Method
   7.4 Effect
8. Fourth Embodiment
   8.1 Configuration
   8.2 Operation
   8.3 Procedure of Vibrator Switching Method
      8.3.1 First Example
      8.3.2 Second Example
   8.4 Effect The embodiments described below illustrate some examples of the present disclosure, and do not limit the contents of the present disclosure. All of the configurations and the operations described in the embodiments are not always indispensable as configurations and operations of the present disclosure. The same constituent elements are denoted by the same reference signs, and overlapping description is omitted.

Figure 1:
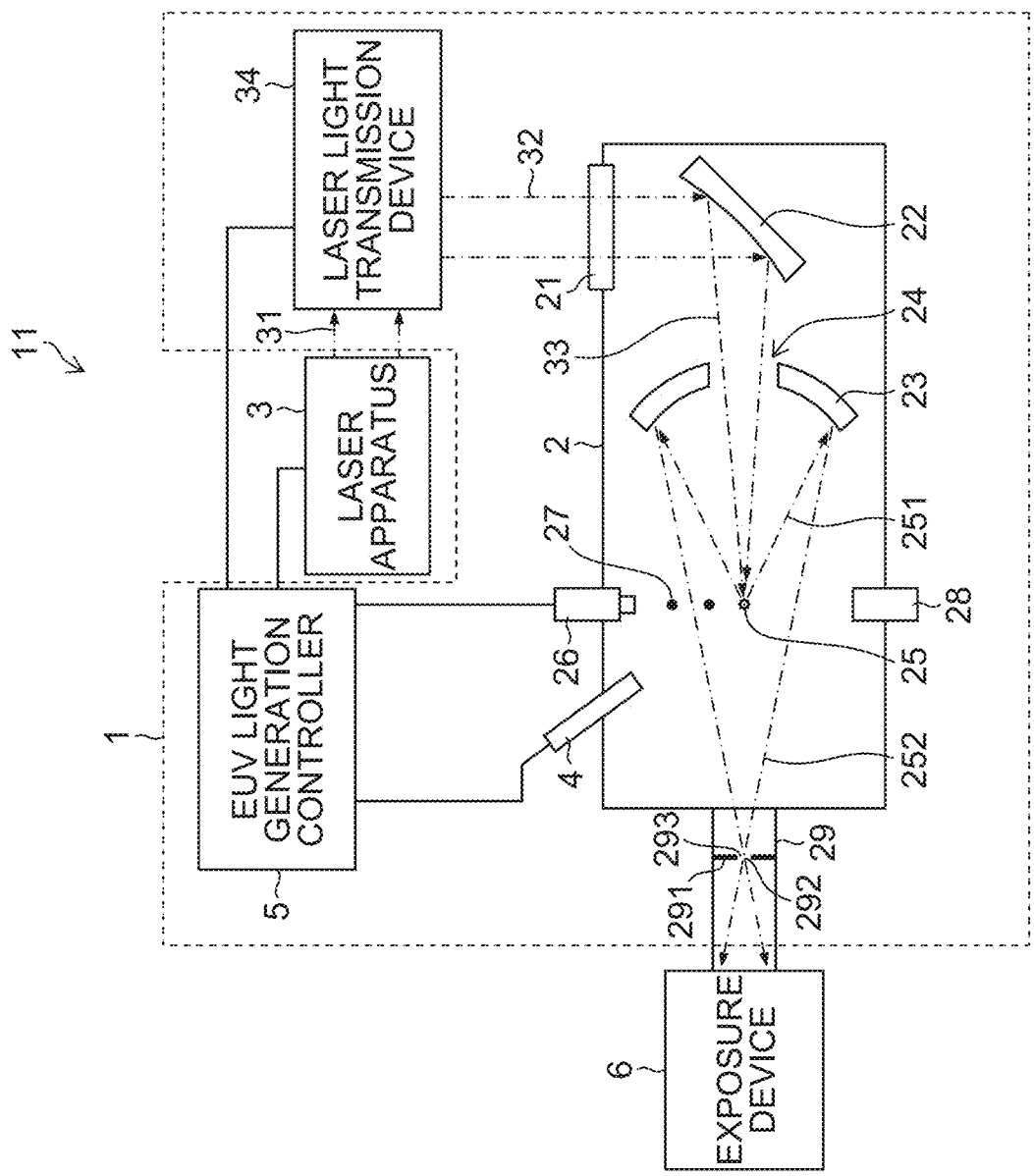
FIG. 1 is a diagram schematically illustrating a configuration of an exemplary LPP type EUV light generation system.

1. Overall Description of Extreme Ultraviolet Light Generation System 1.1 Configuration FIG. 1 schematically illustrates a configuration of an exemplary LPP type EUV light generation system. An EUV light generation apparatus 1 may be used together with at least one laser apparatus 3. In the present disclosure, a system including the EUV light generation apparatus 1 and the laser apparatus 3 is referred to as an EUV light generation system 11. As illustrated in FIG. 1 and described below in detail, the EUV light generation apparatus 1 includes a chamber 2 and a target supply unit 26. The chamber 2 is a sealable container. The target supply unit 26 supplies a target substance to the inside of the chamber 2, and is mounted so as to penetrate a wall of the chamber 2, for example. The material of the target substance output from the target supply unit 26 may include, but not limited to, tin, terbium, gadolinium, lithium, xenon, or a combination of any two or more of them.

A wall of the chamber 2 has at least one through hole. The through hole is closed with a window 21 which transmits pulse laser light 32 having been output from the laser apparatus 3. In the chamber 2, an EUV light condensing mirror 23, for example, having a spheroidal reflection surface is disposed. The EUV light condensing mirror 23 has first and second focuses. For example, a multilayer reflection film in which molybdenum and silicon are alternately layered is formed on the surface of the EUV light condensing mirror 23. The EUV light condensing mirror 23 may be disposed such that the first focus thereof is positioned in a plasma generation region 25 and the second focus thereof is positioned at an intermediate focusing point (IF) 292, for example. A center portion of the EUV light condensing mirror 23 has a through hole 24 through which pulse laser light 33 passes.

The EUV light generation apparatus 1 includes an EUV light generation controller 5, a target sensor 4, and the like. The target sensor 4 detects any or a plurality of presence, trajectory, position, and velocity of the target 27. The target sensor 4 may have an imaging function.

The EUV light generation apparatus 1 also includes a connecting section 29 that allows the inside of the chamber 2 and the inside of the exposure device 6 to communicate with each other. A wall 291 having an aperture 293 is provided in the inside of the connecting section 29. The wall 291 may be disposed such that the aperture 293 is positioned at the second focus position of the EUV light condensing mirror 23.

The EUV light generation apparatus 1 also includes a laser light transmission device 34, a laser light condensing mirror 22, a target recovery unit 28 for recovering the target 27, and the like. The laser light transmission device 34 includes an optical element for defining a transmission state of the laser light, and an actuator for regulating the position, posture, and the like of the optical element.

1.2 Operation

Operation of an exemplary LPP type EUV light generation system will be described with reference to FIG. 1. The pulse laser light 31 having been output from the laser apparatus 3, passes through the window 21 as pulse laser light 32 via the laser light transmission device 34, and enters the chamber 2. The pulse laser light 32 travels inside the chamber 2 along at least one laser light path, is reflected by the laser light condensing mirror 22, and is radiated to at least one target 27 as pulse laser light 33.

The target supply unit 26 outputs a target 27 that is made of the target substance, toward a plasma generation region 25 in the chamber 2. The target 27 is irradiated with at least one pulse included in the pulse laser light 33. The target 27 irradiated with the pulse laser light is made into plasma, and radiation light 251 is emitted from the plasma, EUV light 252 included in the radiation light 251 is selectively reflected by the EUV light condensing mirror 23. The EUV light 252 reflected by the EUV light condensing mirror 23 is condensed at the intermediate focusing point 292, and is output to the exposure device 6. One target 27 may be irradiated with a plurality of pulses included in the pulse laser light 33.

The EUV light generation controller 5 presides over the control of the entire EUV light generation system 11. The EUV light generation controller 5 processes a detection result of the target sensor 4. The EUV light generation controller 5 may control oscillation timing of the laser apparatus 3, radiation direction of the pulse laser light 32, the condensing position of the pulse laser light 33, and the like, for example, based on the detection result of the target sensor 4. The aforementioned various types of control are mere examples. Other types of control may be added as required.

2. Terms

"Target" is an object to be irradiated with laser light introduced to the chamber.

"Target supply unit" is a device for supplying, into the chamber, a target substance such as molten tin used for generating EUV light in the form of droplets.

"Droplet" is a form of a target substance output into the chamber.

3. Problem

A target supply unit includes a vibrator that vibrates a nozzle. The target supply unit outputs a target in a uniform droplet form from the nozzle by providing an electric signal having a frequency corresponding to a period of generating a target to the vibrator. Hereinafter, an electric signal supplied to the vibrator may be described as a driving voltage.

In the case where only one vibrator for driving is provided to the target supply unit, when the vibrator fails, the vibrator does not operate normally. As a result, generation of a target in a uniform droplet form by the target supply unit becomes difficult, whereby the lifetime of the target supply unit ends.

Figure 2:
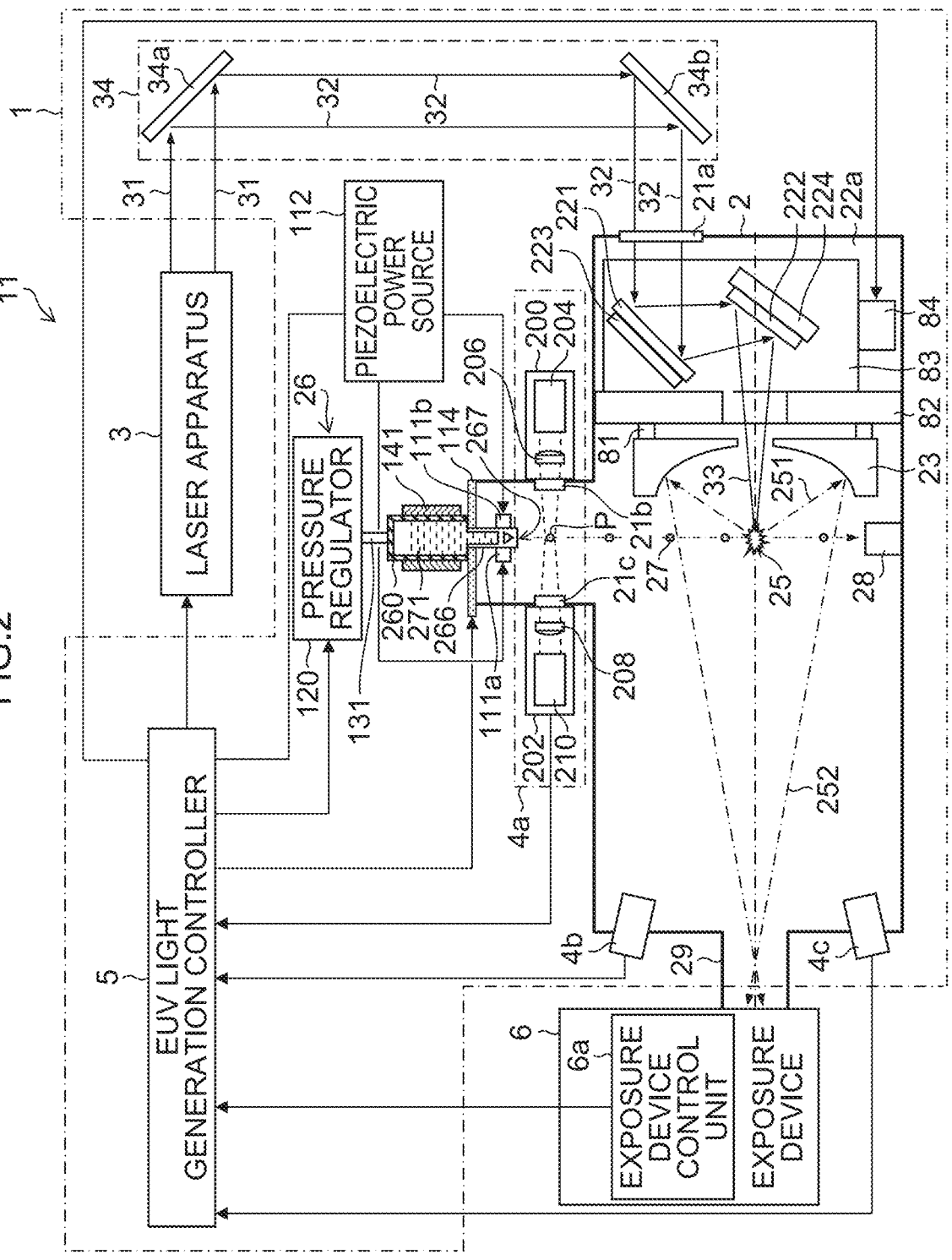
FIG. 2 is a partial cross-sectional view illustrating a configuration of an EUV light generation system applicable to an embodiment of the present disclosure.

4. Description of Extreme Ultraviolet Light Generation System having a Plurality of Vibrators in Target Supply Unit 4.1 Configuration FIG. 2 is a partial cross-sectional view illustrating a structure of an EUV light generation system applicable to an embodiment of the present disclosure. The chamber 2 illustrated in FIG. 2 includes therein a laser light condensing optical system 22a, an EUV light condensing mirror holder 81, an EUV light condensing mirror holder holding plate 82, and a target recovery unit 28.

The laser light condensing optical system 22a includes a high-reflective off-axis paraboloid mirror 221, a high-reflective planar mirror 222, a laser light condensing optical system holding plate 83, and a stage 84 movable in an X direction, a Y direction, and a Z direction.

The laser light condensing optical system 22a is disposed such that the light condensing position of the laser light condensing optical system 22a matches the plasma generation region 25. "Match" may include "substantially match" that can be deemed to match, although it is different strictly.

The high-reflective off-axis paraboloid mirror 221 is supported by a first holder 223. The high-reflective planar mirror 222 is supported by a second holder 224. The target recovery unit 28 is disposed on an extended line of the trajectory of the target 27. The target recovery unit 28 recovers the target substance having passed through the plasma generation region 25.

The laser light transmission device 34 illustrated in FIG. 2 includes a first high-reflective mirror 34a and a second high-reflective mirror 34b. Pulse laser light 31 emitted from the laser apparatus 3 is made incident on the first high-reflective mirror 34a.

Pulse laser light 32 reflected by the first high-reflective mirror 34a is made incident on the second high-reflective mirror 34b. The pulse laser light 32 reflected by the second high-reflective mirror 34b is introduced into the chamber 2 via a first window 21a. Note that the first window 21a illustrated in FIG. 2 corresponds to the window 21 illustrated in FIG. 1.

The target supply unit 26 illustrated in FIG. 2 includes a tank 260, a nozzle member 266, a pressure regulator 120, a heater 141, a first vibrator 111a, a second vibrator 111b, a piezoelectric power source 112 and a stage 114.

Tin is stored as a target material 271 in the tank 260. A material that resists chemical reaction with tin may be used as the material of the tank 260. Molybdenum may be used as the material of the tank 260.

The nozzle member 266 has a nozzle hole 267 having a diameter ranging from 3 micrometers to 6 micrometers. A material that resists chemical reaction with tin may be used as the material of the nozzle member 266. Molybdenum may be used as the material of the nozzle member 266. The target supply unit 26 may include a nozzle holder for fixing the nozzle member 266 to the bottom of the tank 260. The nozzle holder is not illustrated.

A material that resists chemical reaction with tin may be used as the material of the nozzle holder. Molybdenum may be used as the material of the nozzle holder. A portion between the nozzle member 266 and the nozzle holder (not illustrated) may be sealed by face sealing. A portion between the tank 260 and the nozzle member 266 may be sealed by face sealing.

The pressure regulator 120 is connected with an inert gas cylinder. The cylinder is not illustrated. Argon may be used as the inert gas. A gas pipe between the cylinder and the pressure regulator 120 is provided with a valve that can be controlled by the pressure regulator 120. The gas pipe and the valve are not illustrated.

The pressure regulator 120 communicates with the inside of the tank 260 via an introduction pipe 131. The pressure regulator 120 may introduce inert gas having been supplied from a cylinder (not illustrated) via the introduction pipe 131, to the tank 260.

The heater 141 is electrically connected with a heater power source. The heater power source is connected with a temperature controller so as to be able to receive an electric signal. The heater power source and the temperature controller are not illustrated. The heater power source may supply electric power to the heater under control of the temperature controller.

The heater 141 is disposed so as to heat the target material 271 in the tank 260. For example, the heater 141 may be disposed on the outer surface of the tank 260.

Either one of the tank 260 and the nozzle holder (not illustrated) is provided with a temperature sensor. The temperature sensor is not illustrated. The temperature sensor may be disposed to measure the temperature of either one of the tank 260 and the nozzle holder.

The temperature sensor is connected with a temperature controller so as to be able to transmit an electric signal, via an introduction terminal provided to a partition wall of the chamber 2. The introduction terminal is not illustrated. The introduction terminal may maintain the airtightness of the chamber 2, and may electrically insulate an electrical connection line between the temperature sensor and the temperature controller from the chamber 2.

The piezoelectric power source 112 is connected with the EUV light generation controller 5 so as to be able to receive an electric signal. The piezoelectric power source 112 is electrically connected with an electrode of the first vibrator 111a and an electrode of the second vibrator 111b via an introduction terminal provided to a partition wall of the chamber 2. The electrode of the first vibrator 111a, the electrode of the second vibrator 111b, and the introduction terminal are not illustrated.

The introduction terminal may maintain the airtightness of the chamber 2, and electrically insulate an electrical connection line between the piezoelectric power source 112 and the electrodes of the first vibrator 111a and the second vibrator 111b, from the chamber 2.

The first vibrator 111a and the second vibrator 111b may be provided on a side surface of the nozzle member 266. The first vibrator 111a and the second vibrator 111b may be arranged so as to be line-symmetrical with respect to the axis passing through the center of the nozzle hole 267.

A piezoelectric element may be used as each of the first vibrator 111a and the second vibrator 111b. A piezoelectric element may be a piezoelectric member that vibrates in response to an electric signal from the outside. The piezoelectric element may be a piezoelectric member using lead zirconate titanate.

The pressure regulator 120 and the temperature controller are connected with the EUV light generation controller 5 so as to be able to receive an electric signal. The pressure regulator 120 and the temperature controller operate under control of the EUV light generation controller 5.

The inside of the tank 260 may communicate with the nozzle hole 267 via a target flow path provided to the bottom of the tank 260. The target flow path may have a filter for filtering the flowing target material 271. The target flow path and the filter are not illustrated.

The stage 114 is disposed at a position where the tank 260 and the nozzle member 266 are movable on a plane parallel to an XZ plane. The stage 114 is connected with the EUV light generation controller 5 so as to be able to receive an electric signal. The stage 114 moves the positions of the tank 260 and the nozzle member 266 with respect to the position of the chamber 2 on a plane parallel to the XZ plane, under control of the EUV light generation controller 5.

The EUV light generation apparatus 1 illustrated in FIG. 2 includes a timing sensor 4a. The timing sensor 4a is disposed at a position for detecting that the target 27 has passed at a detection position P before the target 27 reaches the plasma generation region 25. The timing sensor 4a outputs a passage tuning signal representing the timing that the target 27 passes through the detection position P.

The timing sensor 4a includes an illumination unit 200 and a light receiving unit 202. The illumination unit 200 and the light receiving unit 202 are disposed on both sides of a passage region of the target 27 across the trajectory of the target 27.

The illumination unit 200 includes a light source 204 and an illumination optical system 206. The illumination unit 200 is disposed at a position where illumination light can be emitted to the inside of the chamber 2 via the second window 21b provided to the partition wall of the chamber 2. The illumination light emitted from the light source 204 is radiated to the trajectory of the target 27 via the illumination optical system 206 and the second window 21b.

The light receiving unit 202 includes a light receiving optical system 208 and an optical sensor 210. The light receiving unit 202 is disposed at a position where the illumination light emitted from the illumination unit 200 can be received via a third window 21c. The illumination light made incident via the third window 21c reaches the optical sensor 210 via the light receiving optical system 208. The optical sensor 210 outputs a detection signal of the target 27 corresponding to the amount of the received illumination light.

The timing sensor 4a is connected with the EUV light generation controller 5 so as to be able to transmit an electric signal. The timing sensor 4a outputs, to the EUV light generation controller 5, a detection signal that is output from the optical sensor 210 and represents the timing that the target 27 passes through the detection position P.

The target position measuring sensor 4b illustrated in FIG. 2 may be disposed facing the plasma generation region 25. The position of the trajectory of the target 27 that passed through the detection position P of the target position measuring sensor 4b may be detected.

The target image measuring sensor 4c may be disposed facing the plasma generation region 25. The target image measuring sensor 4c may acquire an image of the target 27 that passed through the detection position P.

The target position measuring sensor 4b and the target image measuring sensor 4c are connected with the EUV light generation controller 5 so as to be able to transmit an electric signal. The target position measuring sensor 4b may output a detection signal representing the position of the trajectory of the target 27, to the EUV light generation controller 5. The target image measuring sensor 4c may output a detection signal representing an image of the target 27, to the EUV light generation controller 5.

The target position measuring sensor 4b may include a second illumination unit and an imaging device such as a CCD (Charge Coupled Device) camera. In FIG. 2, the second illumination unit and the imaging device are not illustrated. The second illumination unit is denoted by a reference numeral 280 in FIG. 3. The imaging devices are denoted by reference numerals 282 and 284 in FIG. 3.

Figure 3:
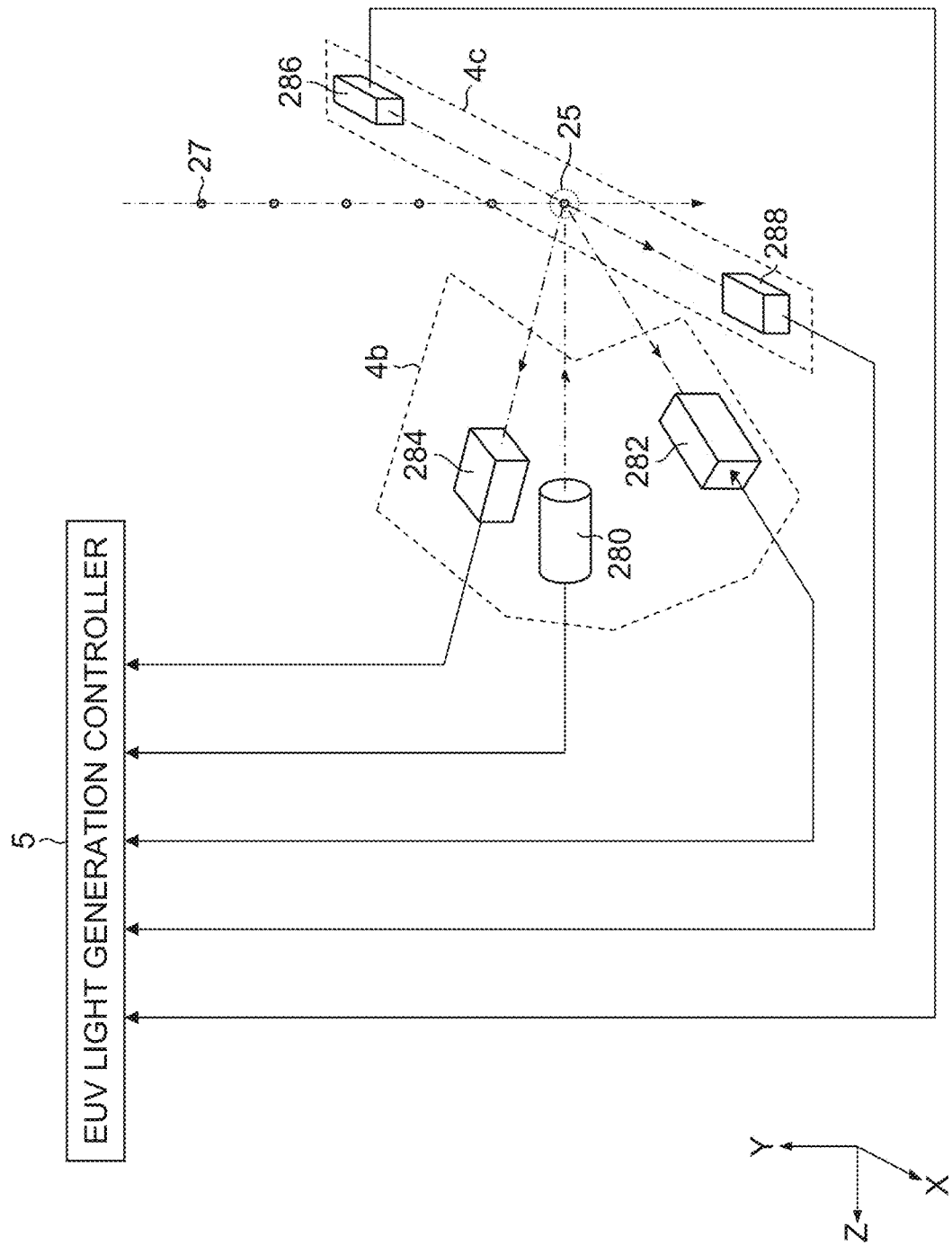
FIG. 3 is a diagram illustrating an exemplary configuration of a target position measuring sensor and an exemplary configuration of a target image measuring sensor illustrated in FIG. 2.

The target position measuring sensor 4b illustrated in FIG. 2 images a reflected image of the illumination light by the target 27. As illustrated in FIG. 3, a plurality of imaging devices may be provided, and the respective imaging devices may image the target 27 from different directions and acquire images captured from different directions.

It is possible to calculate a position of the target 27 on a predetermined plane from the images captured from different directions. The target position measuring sensor 4b may be provided with a shutter for blocking plasma light. The shutter may be opened and closed with a gate signal delayed by a prescribed period with respect to a detection signal that is output from the timing sensor 4a and represents the passage timing of the target 27.

The target image measuring sensor 4c may include a third illumination unit and an imaging device such as a CCD camera. In FIG. 2, the third illumination unit and the imaging device are not illustrated. The third illumination unit is denoted by a reference numeral 286 in FIG. 3. The imaging device is denoted by a reference numeral 288 in FIG. 3.

The target image measuring sensor 4c images a transmitted image of the illumination light by the target 27. A high-illuminance light source such as a laser light source may be used as the third illumination unit. Thereby, the target image measuring sensor 4c is able to image the target 27 by exposure in a relatively short period.

The target image measuring sensor 4c is able to capture an image in which a position of the target 27 at a certain time can be specified, by exposure in a relatively short period. The target image measuring sensor 4c may have a shutter for blocking plasma light. The shutter may be opened and closed with a gate signal delayed by a prescribed period with respect to a detection signal that is output from the timing sensor 4a and represents the passage timing of the target 27.

The target sensor 4 illustrated in FIG. 1 may include the timing sensor 4a, the target position measuring sensor 4b, and the target image measuring sensor 4c, illustrated in FIG. 2. Details of the target position measuring sensor 4b and the target image measuring sensor 4c will be described below.

4.2 Operation

The EUV light generation controller 5 performs the operation described below when an output preparation signal of the target 27 is input from the exposure device control unit 6a of the exposure device 6.

The EUV light generation controller 5 controls the temperature controller such that the temperature of the target material 271 in the tank 260 becomes the melting point or higher. In response to the control by the EUV light generation controller 5, the temperature controller drives the heater power source such that a detection value of the temperature sensor becomes a predetermined temperature or higher.

In the case where tin is used as the target material 271, the predetermined temperature may be the melting point of tin or higher. For example, while the melting point of tin is 232° C., the predetermined temperature may be 232° C. or higher. The predetermined temperature may be defined as a temperature range. For example, the temperature range may range from 240° C. to 290° C., relative to 232° C. that is the melting point of tin.

The EUV light generation controller 5 may determine whether or not a detection value of the temperature sensor maintains a temperature equal to or higher than the predetermined temperature for a predetermined period. When a temperature equal to or higher than the predetermined temperature is maintained for a predetermined period, the EUV light generation controller 5 may notify the exposure device control unit 6a of the exposure device 6 that output preparation of the target 27 is completed. The EUV light generation controller 5 may wait until a signal requesting output of the target 27 is input.

When a signal requesting output of the target 27 is input, the EUV light generation controller 5 controls the pressure regulator 120 to raise the pressure inside the tank 260 to a predetermined pressure. The predetermined pressure may be about 40 megapascals.

The EUV light generation controller 5 may control the pressure regulator 120 to maintain the pressure inside the tank 260 at the predetermined pressure. In a state where the pressure inside the tank 260 is maintained at a predetermined pressure, a jet of the target material 271 may be output from the nozzle hole 267.

The EUV light generation controller 5 controls the piezoelectric power source 112 such that a jet of the target material 271, output from the nozzle hole 267, is changed into droplets having a predetermined size and a predetermined cycle. Thereby, a driving voltage of a predetermined waveform may be applied from the piezoelectric power source 112 to the first vibrator 111a.

The vibration generated in the first vibrator 111a, to which the driving voltage of the predetermined waveform is applied, may be transmitted to the target material 271 via the nozzle holder, the nozzle member 266, and the tank 260. Thereby, a jet of the target material 271 may be divided and changed into droplets having a predetermined size and a predetermined cycle.

The EUV light generation controller 5 may output a gate signal delayed by a prescribed period with respect to a detection signal output from the timing sensor 4a, to the target position measuring sensor 4b and the target image measuring sensor 4c.

The target position measuring sensor 4b may image the plasma generation region 25 in accordance with a gate signal output from the EUV light generation controller 5, and output an imaging signal to the EUV light generation controller 5.

The EUV light generation controller 5 may use the imaging signal output from the target position measuring sensor 4b to calculate the position of the target 27 in the plasma generation region 25. For example, the EUV light generation controller 5 may calculate the coordinates of the target 27 in a coordinate system set in the plasma generation region 25.

In the case where the coordinate system set in the plasma generation region 25 is a two-dimensional coordinate system, the EUV light generation controller 5 may calculate two-dimensional coordinates of the target 27. For example, the EUV light generation controller 5 may calculate coordinates on the XZ plane.

The EUV light generation controller 5 may operate the stage 114 of the target supply unit 26 so as to decrease the deviation between the target position of the target 27 and the position of the detected target.

The target image measuring sensor 4c may image the plasma generation region 25 in accordance with a gate signal output from the EUV light generation controller 5, and output an imaging signal to the ELY light generation controller 5.

The EUV light generation controller 5 may use the imaging signal output from the target image measuring sensor 4c to calculate the position of the target 27 in the plasma generation region 25. For example, the EUV light generation controller 5 may calculate the coordinates of the target 27 in a coordinate system set in the plasma generation region 25. The EUV light generation controller 5 may calculate the position in the Y direction in the coordinate system set in the plasma generation region 25.

The EUV light generation controller 5 may add a delay period to a light emission trigger signal to be output to the laser apparatus 3 such that the laser light is radiated to the target position of the target 27, according to the measured position of the target 27.

4.3 Description of Target Position Measuring Sensor and Target Image Measuring Sensor 4.3.1 Configuration FIG. 3 is a diagram illustrating an exemplary configuration of the target position measuring sensor and an exemplary configuration of the target image measuring sensor illustrated in FIG. 2. The target position measuring sensor 4b illustrated in FIG. 3 includes a first illumination device 280, a first imaging device 282, and a second imaging device 284. Each of the first imaging device 282 and the second imaging device 284 may have an illumination device.

The first imaging device 282 illustrated in FIG. 3 is disposed at a position where the target 27 is imaged from the X direction. The second imaging device 284 illustrated in FIG. 3 is disposed at a position where the target 27 is imaged from the Z direction. The imaging direction of the first imaging device 282 is not limited to the X direction. Also, the imaging direction of the second imaging device 284 is not limited to the Z direction.

It is only necessary that the imaging direction of the first imaging device 282 and the imaging direction of the second imaging device 284 are different from each other. The imaging direction of the first imaging device 282 and the imaging direction of the second imaging device 284 may be directions orthogonal to each other.

The first illumination device 280 illustrated in FIG. 3 is disposed such that reflected light of the target 27 is made incident on the first imaging device 282 and the second imaging device 284.

The target image measuring sensor 4c illustrated in FIG. 3 includes a second illumination device 286 and a third imaging device 288. A laser light source or a light source capable of emitting high-luminance illumination light such as a flash lamp may be used as the second illumination device 286.

The third imaging device 288 illustrated in FIG. 3 is disposed at a position where the target 27 is imaged from a direction that can specify the Y direction on a screen on which the subject image is displayed. The second illumination device 286 illustrated in FIG. 3 is disposed at a position opposite to the third imaging device 288 across the trajectory of the target 27.

Illumination light emitted from the second illumination device 286 and passing through near the target 27 may be made incident on the third imaging device 288. The third imaging device 288 may capture an image of the target 27 blocking the illumination light emitted from the second illumination device 286.

4.3.2 Operation

The EUV light generation controller 5 may output a gate signal to the first imaging device 282 and the second imaging device 284, and capture an image of the target 27 from each of the first imaging device 282 and the second imaging device 284.

Figure 4:
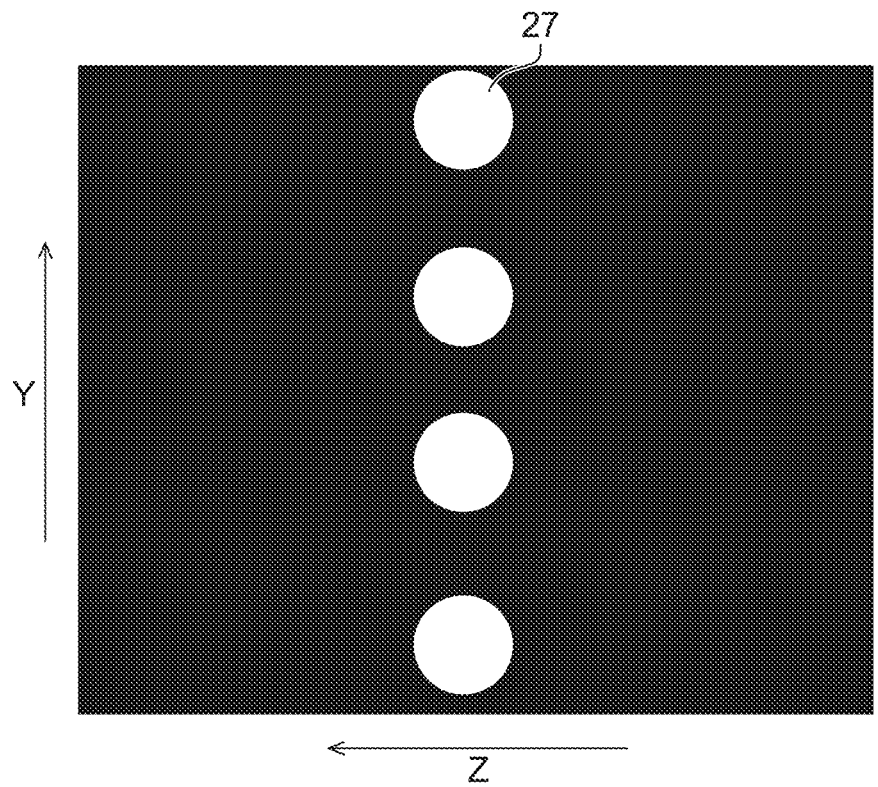
FIG. 4 is a diagram illustrating an example of an image captured by a first imaging device illustrated in FIG. 3.

FIG. 4 is a diagram illustrating an example of an image captured by the first imaging device illustrated in FIG. 3. The captured image by the first imaging device 282 illustrated in FIG. 4 is an image obtained by projecting a plurality of targets 27, output continuously at a constant cycle, on the YZ plane. The position of the trajectory of the target 27 in the Z direction can be specified in the image captured by the first imaging device 282 illustrated in FIG. 4.

Figure 5:
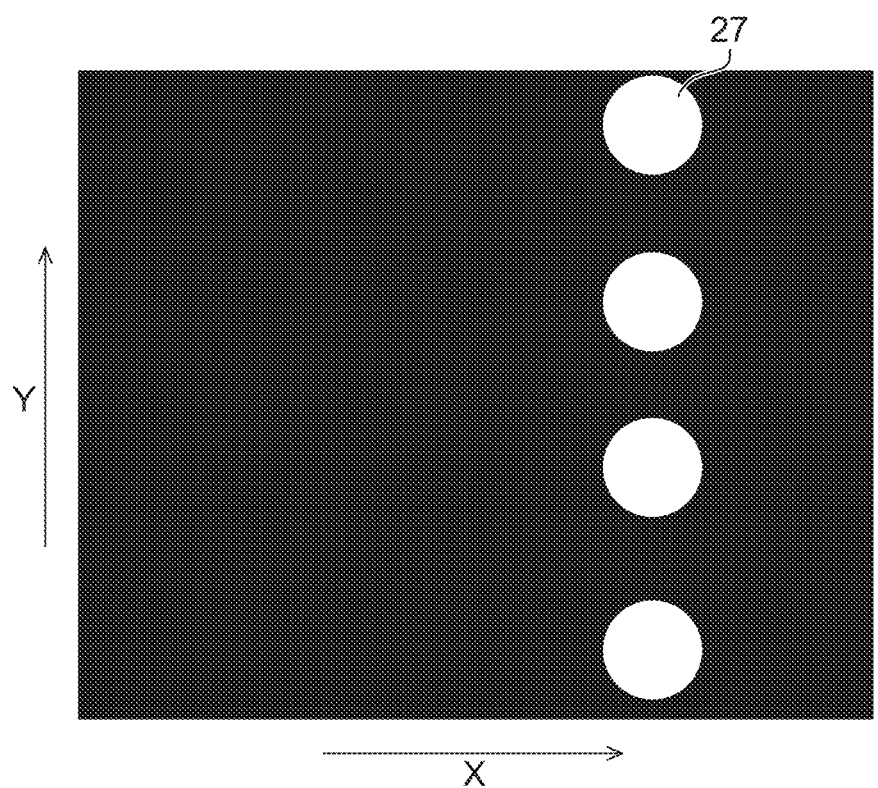
FIG. 5 is a diagram illustrating an example of an image captured by a second imaging device illustrated in FIG. 3.

FIG. 5 is a diagram illustrating an example of an image captured by the second imaging device illustrated in FIG. 3. The image captured by the second imaging device 284 illustrated in FIG. 5 is an image obtained by projecting a plurality of targets 27 that are output continuously at a constant cycle on the XY plane. The position of the trajectory of the target 27 in the X direction can be specified in the image captured by the second imaging device 284 illustrated in FIG. 5.

Transmitted light of high-luminance illumination light is made incident on the third imaging device 288. Accordingly, the period of a gate signal representing the light receiving period of the third imaging device 288 may be relatively short. When the period of a gate signal representing the light receiving period of the third imaging device 288 is short, the light receiving period of the third imaging device 288 is shortened. Thereby, the third imaging device 288 is capable of capturing a still image of the target 27.

Figure 6:
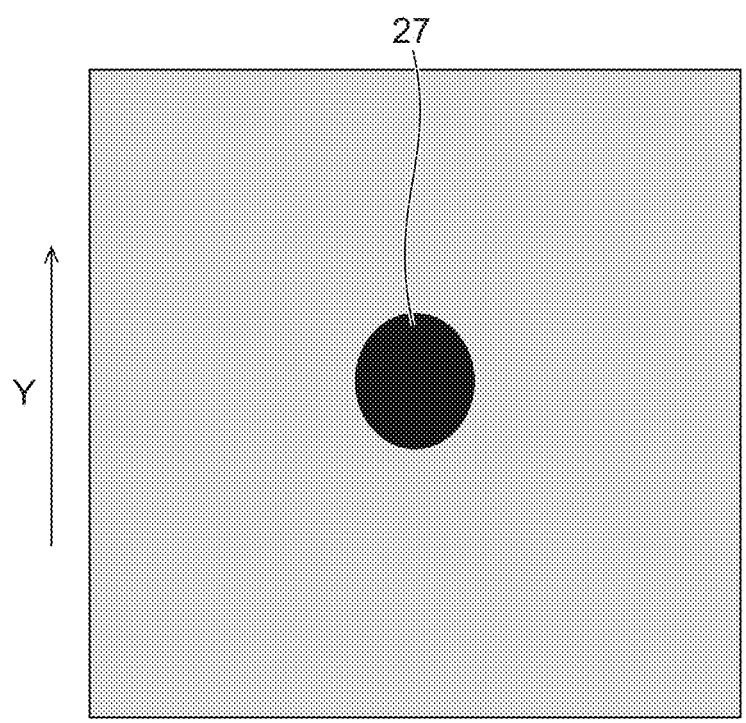
FIG. 6 is a diagram illustrating an example of an image captured by a third imaging device illustrated in FIG. 3.

FIG. 6 is a diagram illustrating an example of a captured image by the third imaging device illustrated in FIG. 3. It is possible to specify the coordinates, in the Y axis direction, of the target 27 that reached the plasma generation region 25 at a certain time by capturing a still image of the target 27 illustrated in FIG. 6.

5. First Embodiment 5.1 Configuration

Figure 7:
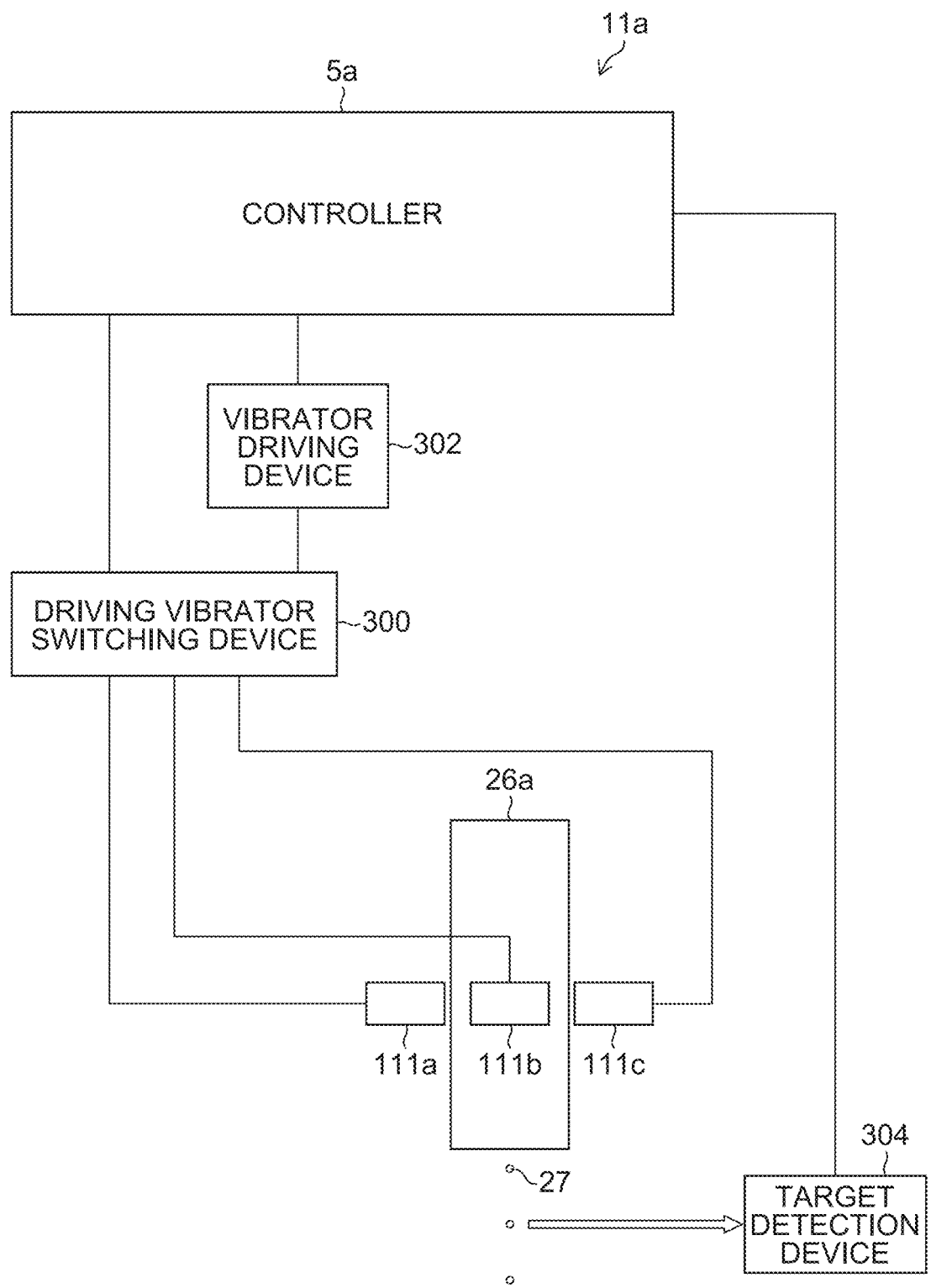
FIG. 7 is a block diagram schematically illustrating a configuration of an EUV light generation system according to a first embodiment.

FIG. 7 is a block diagram schematically illustrating a configuration of an EUV light generation system according to the first embodiment. The EUV light generation system 11a illustrated in FIG. 7 includes a target supply unit 26a, a controller 5a, a driving vibrator switching device 300, a vibrator driving device 302, and a target detection device 304.

The target supply unit 26a illustrated in FIG. 7 includes a plurality of vibrators. As illustrated in FIG. 7, the target supply unit 26a may include three vibrators, namely, a first vibrator 111a, a second vibrator 111b, and a third vibrator 111c.

Electrodes (not illustrated) of the first vibrator 111a, the second vibrator 111b, and the third vibrator 111c are connected with the driving vibrator switching device 300 so as to be able to receive a driving voltage. The driving vibrator switching device 300 is connected with the vibrator driving device 302 so as to be able to receive a driving voltage. The driving vibrator switching device 300 and the vibrator driving device 302 are connected with the controller 5a so as to be able to receive an electric signal.

The target detection device 304 is disposed at a position where the state of the target 27 output from the target supply unit 26a can be detected. The target detection device 304 is connected with the controller 5a so as to be able to receive an electric signal.

The timing sensor 4a illustrated in FIG. 2 may be used as the target detection device 304. The target image measuring sensor 4c illustrated in FIG. 2 may be used as the target detection device 304.

The controller 5a and the driving vibrator switching device 300 illustrated in FIG. 7 may be included in the EUV light generation controller 5 illustrated in FIG. 2, or may be provided separately from the EUV light generation controller 5 and connected with the EUV light generation controller 5 so as to be able to receive an electric signal.

The controller 5a may include one or more processors. The controller 5a may include a memory associated with the processor. The vibrator driving device 302 illustrated in FIG. 7 may include the piezoelectric power source 112 illustrated in FIG. 7.

5.2 Operation 5.2.1 Overview

The target supply unit 26a applied to the EUV light generation system 11a includes "m" pieces of vibrators. "m" represents 2 or larger integer. The controller 5a determines any vibrator, from among the "m" pieces of vibrators, as an initial vibrator to be driven. The initial vibrator is referred to as a first vibrator. A vibrator to be driven means a vibrator to which a driving voltage is supplied and that is driven for generating the target 27.

The controller 5a selects a vibrator to be driven, by the driving vibrator switching device 300. The initially selected vibrator is referred to as a first vibrator. The first vibrator is any one of the "m" pieces of vibrators.

For example, the controller 5a may output a selection signal representing the information of the first vibrator to the driving vibrator switching device 300. For example, information of a vibrator may be an identification number of a vibrator. The identification number of a vibrator may be an integer from 1 to "m" given to each of the "m" pieces of vibrators.

The controller 5a supplies a driving voltage to the first vibrator to vibrate the first vibrator. The controller 5a regulates a driving parameter of the first vibrator such that the target 27 is joined together as a droplet having specified performance, to thereby determine the driving parameter of the first vibrator.

An example of a droplet having specified performance is a joined droplet in which the target 27 passes a predetermined observation position with a passage frequency of the target 27 at 100 kilohertz. The passage frequency of the target 27 is calculated as an inverse number of a passage timing interval between the targets 27. The driving parameter may be amplitude of a voltage waveform of a driving voltage or a duty of a voltage waveform of a driving voltage.

The controller 5a vibrates the first vibrator by applying the determined driving parameter to generate the target 27. The target detection device 304 detects the state of the target 27. Details of detection of the state of the target 27 will be described later.

The controller 5a determines presence or absence of a failure in the first vibrator, based on the detection result of the state of the target 27 output from the target detection device 304. A failure of a vibrator may include a state where the vibrator does not vibrate, a state where the target 27 is not output although the vibrator vibrates, or a state where the target 27 satisfying a predetermined condition is not output although the vibrator vibrates. Details of failure determination of a vibrator will be described below.

When the controller 5a determines that the first vibrator is failed, the controller 51 determines, by the driving vibrator switching device 300, a vibrator that is other than the first vibrator and is an unused vibrator to be a vibrator to be driven. For example, a vibrator determined to be a vibrator to be driven instead of the first vibrator is set as a second vibrator.

When the controller 5a outputs vibration for switching the vibrator to the driving vibrator switching device 300, the controller 5a may follow a light emission stop permission instruction output from the exposure device 6 illustrated in FIG. 2.

The controller 5a regulates and determines the driving parameter of the second vibrator. The controller 5a vibrates the second vibrator to generate the target 27. The target detection device 304 detects the state of the target 27. The controller 5a determines presence or absence of a failure in the second vibrator, based on the detection result of the state of the target 27 output from the target detection device 304.

In this manner, when the controller 5a determines and selects an n-th vibrator, that is an unused vibrator, to be a vibrator to be driven, the controller 5a regulates and determines the driving parameter of the n-th vibrator. Here, "n" is an integer that is 1 or larger but "m" or smaller.

The controller 5a vibrates the n-th vibrator to generate the target 27. The target detection device 304 detects the state of the target 27. When the controller 5a determines that the n-th vibrator is failed based on the detection result of the state of the target 27 by the target detection device 304, the controller 5a determines and selects an (n+1)-th vibrator as a vibrator to be driven.

When the controller 5a switches the vibrator to be driven from the n-th vibrator to the (n+1)-th vibrator, the controller 5a may stop vibration of the n-th vibrator in accordance with the light emission stop permission instruction output from the exposure device 6 illustrated in FIG. 2.

The controller 5a regulates and determines the driving parameter of the (n+1)-th vibrator. The controller 5a vibrates the (n+1)-th vibrator to generate the target 27. The target detection device 304 detects the state of the target 27.

In this way, when the controller 5a determines that the vibrator to be driven is failed, the controller 5a determines a vibrator to be driven from among unused vibrators and changes the vibrator to it, until the respective vibrators from the first vibrator to the m-th vibrator fail.

5.2.2 Failure Determination when Target Detection Device is Timing Sensor

The target detection device 304 illustrated in FIG. 7 may also be used as the timing sensor 4a illustrated in FIG. 2. In the case where the target detection device 304 illustrated in FIG. 7 is the timing sensor 4a illustrated in FIG. 2, the timing sensor 4a detects a passage timing interval between the targets 27. The controller 5a may determine that the driving vibrator is failed when the distance between the targets 27 calculated from the passage timing interval between the targets 27 is equal to or smaller than a predetermined prescribed value. The distance between the targets 27 is calculated by multiplying the passage timing interval between the targets 27 by the velocity of the target 27. The velocity of the target 27 can be determined based on the output condition of the target.

For example, it is assumed that a standard distance between the targets 27 is 1,000 micrometers. When 3σ (99.73 percent) that is a variation in the distance between the targets 27 is smaller than 5 micrometers and larger than minus 5 micrometers, the controller 5a may determine that the vibrator is normal.

On the other hand, when 3σ that is a variation in the distance between the targets 27 is 5 micrometers or larger or minus 5 micrometers or smaller, the controller 5a may determine that the vibrator is failed. 5 micrometers correspond to 0.5 percent of 1,000 micrometers that is the standard distance between the targets 27.

A sampling period of the timing sensor 4a may be 0.1 seconds. The number of samples may be 10,000.

Further, when an absolute value of a maximum value of a difference or an absolute value of a minimum value of a difference, calculated by subtracting the distance between the targets 27 from the standard distance between the targets 27, is smaller than 0.5 percent of the standard distance between the targets 27, the controller 5a may determine that the vibrator is normal. When an absolute value of a maximum value of a difference or an absolute value of a minimum value of a difference, calculated by subtracting the distance between the targets 27 from the standard distance between the targets 27, is equal to or larger than 0.5 percent of the standard distance between the targets 27, the controller 5a may determine that the vibrator is failed.

5.2.3 Failure Determination when Target Detection Device is Target Image Measuring Sensor The target detection device 304 illustrated in FIG. 7 may also be used as the target image measuring sensor 4c illustrated in FIG. 2. When the target detection device 304 illustrated in FIG. 7 is the target image measuring sensor 4c illustrated in FIG. 2, a distance between the targets 27 obtained from the analysis result of an image captured by the target image measuring sensor 4c may be used as an index for failure determination of the vibrator.

For example, it is assumed that a standard distance between the targets 27 is 1,000 micrometers. When 3σ that is a variation in the distance between the targets 27 is smaller than 5 micrometers and larger than minus 5 micrometers, the controller 5a may determine that the vibrator is normal.

On the other hand, when 3σ that is a variation in the distance between the targets 27 is 5 micrometers or larger or minus 5 micrometers or smaller, the controller 5a may determine that the vibrator is failed. 5 micrometers correspond to 0.5 percent of 1,000 micrometers that is the standard distance between the targets 27. The diameter of the target 27 in a droplet form may be 20 micrometers.

Further, when an absolute value of a maximum value of a difference or an absolute value of a minimum value of a difference, calculated by subtracting the distance between the targets 27 from the standard distance between the targets 27, is smaller than 0.5 percent of the standard distance between the targets 27, the controller 5a may determine that the vibrator is normal. When an absolute value of a value, calculated by subtracting the distance between the targets 27 from the standard distance between the targets 27, is equal to or larger than 0.5 percent of the standard distance between the targets 27, the controller 5a may determine that the vibrator is failed.

5.3 Procedure of Vibrator Switching Method

Figure 8:
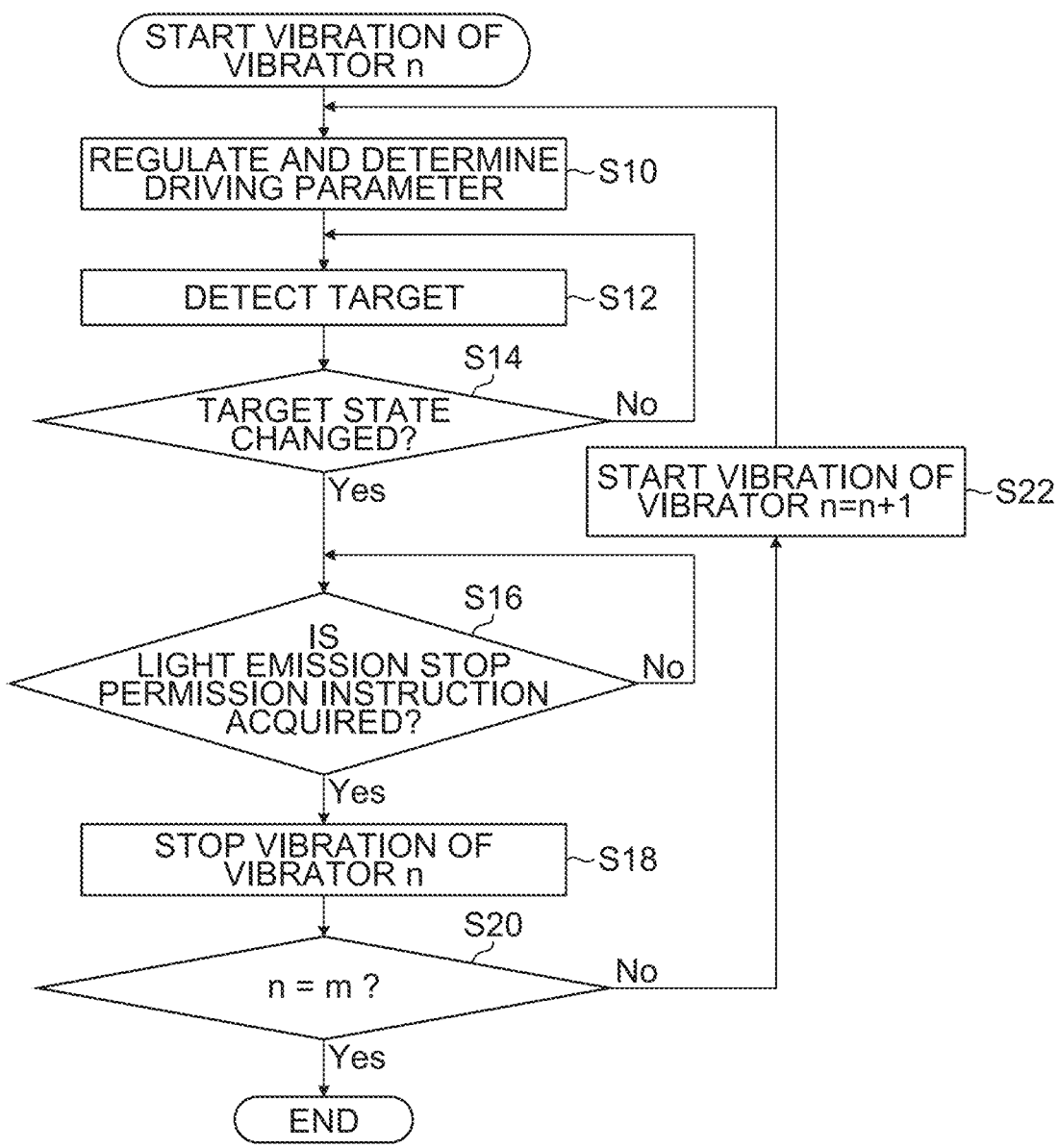
FIG. 8 is a flowchart illustrating a procedure of a vibrator switching method applied to the EUV light generation system according to the first embodiment.

FIG. 8 is a flowchart illustrating a procedure of a vibrator switching method applied to the EUV light generation system according to the first embodiment. The controller 5a illustrated in FIG. 7 determines that the n-th vibrator, among the "m" pieces of vibrators provided to the target supply unit 26a, to be a vibrator to be driven, and starts vibration of the n-th vibrator.

At step S10 in FIG. 8, the controller 5a illustrated in FIG. 7 regulates the driving parameter of the n-th vibrator to determine the driving parameter of the n-th vibrator, and vibrates the n-th vibrator. At step S12, detection of the target 27 is executed by the target detection device 304 illustrated in FIG. 7.

At step S14, the controller 5a determines whether or not the state of the target 27 is changed, based on the detection result of the target 27 by the target detection device 304.

At step S14, when the controller 5a determines that the state of the target 27 is not changed, "No" determination is made. In the case of "No" determination, the controller 5a proceeds to step S12 of FIG. 8, and step S12 and step S14 are repeatedly executed until "Yes" determination is made at step S14.

At step S14, when the controller 5a determines that the state of the target 27 is changed, "Yes" determination is made. In the case of "Yes" determination, the controller 5a proceeds to step S16 of FIG. 8. At step S16, the controller 5a determines whether or not a light emission stop permission instruction from the exposure device 6 is acquired.

At step S16, when the controller 5a does not acquire a light emission stop permission instruction from the exposure device 6, "No" determination is made. In the case of "No" determination, the controller 5a continues determination of whether or not a light emission stop permission instruction from the exposure device 6 is acquired.

At step S16, when the controller 5a acquires a light emission stop permission instruction from the exposure device 6, "Yes" determination is made. In the case of "Yes" determination, the controller 5a proceeds to step S18 of FIG. 8.

At step S18, the controller 5a stops vibration of the n-th vibrator by the vibrator driving device 302. At step S18 of FIG. 8, when vibration of the n-th vibrator is stopped, the controller 5a proceeds to step S20.

At step S20, the controller 5a determines whether or not the n-th vibrator is the last vibrator. The last vibrator is the m-th vibrator. At step S20, when the controller 5a determines that the n-th vibrator is not the last vibrator, "No" determination is made. In the case of "No" determination, the controller 5a proceeds to step S22.

At step S22, the controller 5a determines the (n+1)-th vibrator to be a vibrator to be driven, and starts vibration of the (n+1)-th vibrator by the vibrator driving device 302. The (n+1)-th vibrator may be any unused vibrator. Thereafter, the controller 5a sequentially executes the processes from step S10 to step S20 until "Yes" determination is made at step S20.

At step S20, when the controller 5a determines that the n-th vibrator is the last vibrator, "Yes" determination is made. In the case of "Yes" determination, the controller 5a ends switching of the vibrators.

5.4 Effect

Even if a vibrator driven for generating a target is failed, the failed vibrator is switched to the other vibrator. Therefore, it is not necessary to replace the target supply unit when the vibrator fails. Thereby, the lifetime of the target supply unit can be extended by the number of pieces of the vibrators provided to the target supply unit.

Further, as the target state is detected directly, it is possible to perform failure determination of a vibrator more accurately. As a result, reliability of the EUV light generation system is improved.

Each of the target supply unit 26 and the target supply unit 26a in the present disclosure is one aspect of a target supply apparatus.

The "m" pieces of vibrators including the first vibrator 111a, the second vibrator 111b, and the third vibrator 111c in the present disclosure are one aspect of a plurality of vibrators including a first vibrator. The target detection device 304 of the present disclosure is one aspect of a detection unit.

An unused vibrator among the "m" pieces of vibrators including the first vibrator 111a, the second vibrator 111b, and the third vibrator 111c in the present disclosure is one aspect of the other vibrator different from a first vibrator. A driving vibrator switch in the present disclosure is one aspect of a vibrator switching unit. The controller 5a in the present disclosure is one aspect of a control unit. The vibrator driving device 302 in the present disclosure is one aspect of a vibrator driving unit.

The timing sensor 4a in the present disclosure is one aspect of a passage timing interval measuring unit that measures a passage timing interval between respective targets in a target passage route. The timing sensor 4a in the present disclosure is one aspect of a timing measuring unit that measures a passage timing interval between respective targets in order to regulate the output timing of the targets output from the nozzle. The illumination unit 200 provided to the timing sensor 4a in the present disclosure is one aspect of a first illumination unit.

The third imaging device 288 provided to the target image measuring sensor 4c in the present disclosure is one aspect of an imaging unit that images the target output from the nozzle. The second illumination device 286 provided to the target image measuring sensor 4c in the present disclosure is one aspect of a second illumination unit.

6. Second Embodiment 6.1 Configuration

Figure 9:
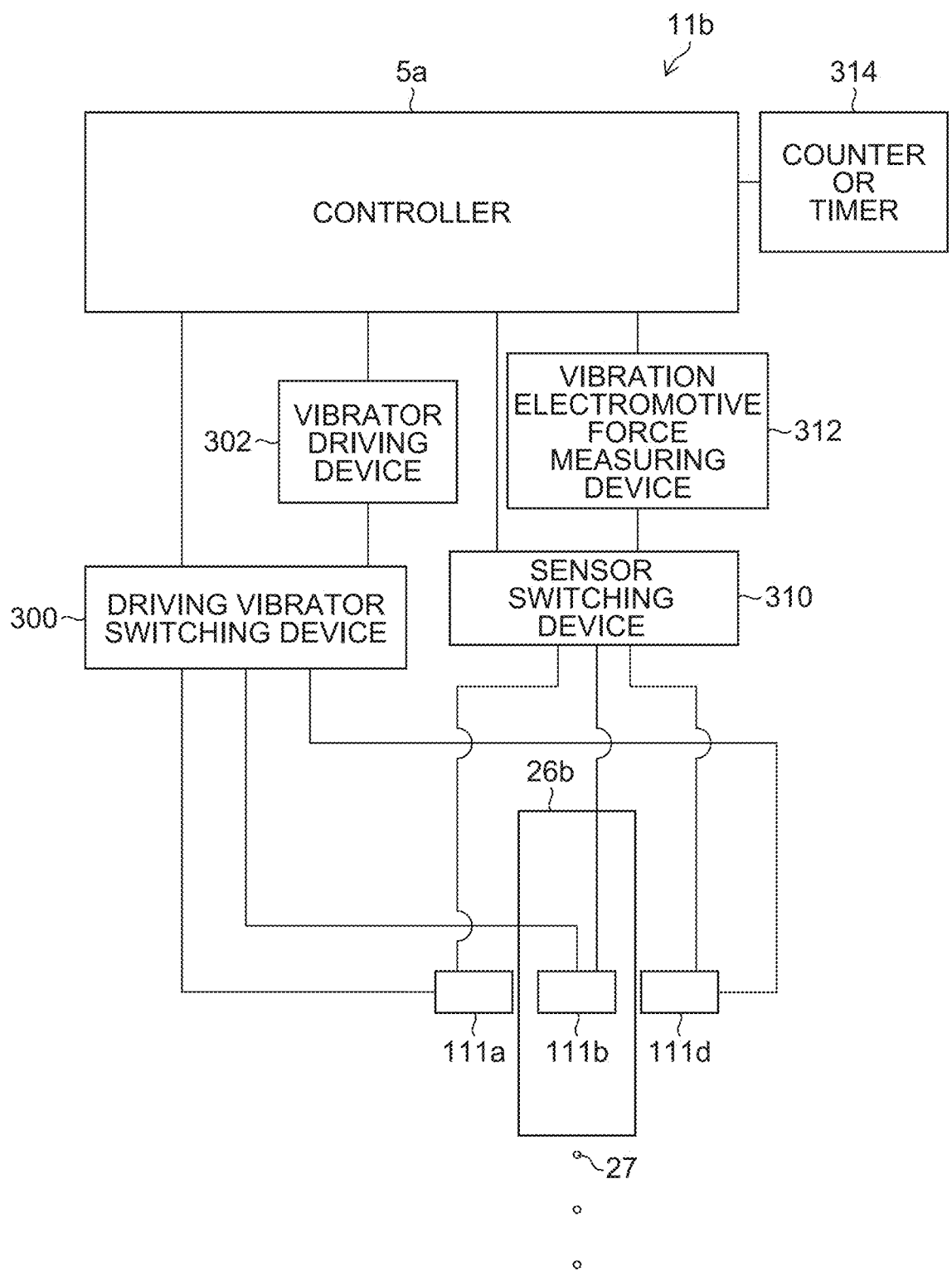
FIG. 9 is a block diagram schematically illustrating a configuration of an EUV light generation system according to a second embodiment.

FIG. 9 is a block diagram schematically illustrating a configuration of an EUV light generation system according to a second embodiment. An EUV light generation system 11b illustrated in FIG. 9 includes a target supply unit 26b, a sensor switching device 310, a vibration electromotive force measuring device 312, and a counter 314. The counter 314 may be a timer.

The target supply unit 26a illustrated in FIG. 9 includes a plurality of vibrators. The vibrators include at least one vibrator usable as a vibration sensor. A fourth vibrator 111d illustrated in FIG. 9 may be a vibrator usable as a vibration sensor.

Electrodes (not illustrated) of the first vibrator 111a, the second vibrator 111b, and the fourth vibrator 111d are connected with the sensor switching device 310 so as to be able to receive a driving voltage. The sensor switching device 310 is connected with the vibration electromotive force measuring device 312 so as to be able to receive an electric signal. The sensor switching device 310 and the vibration electromotive force measuring device 312 are connected with the controller 5a so as to be able to receive an electric signal. The counter 314 is connected with the controller 5a so as to be able to transmit an electric signal.

6.2 Operation

The controller 5a determines one vibrator, not used for driving, to be a vibration sensor, from among the vibrators provided to the target supply unit 26b. The m-th vibrator may be determined to be a vibration sensor. For example, the fourth vibrator 111d in FIG. 9 may be the m-th vibrator and may be determined to be a vibration sensor. The m-th vibrator is any vibrator among the "m" pieces of vibrators.

The controller 5a selects the m-th vibrator as a vibration sensor, by the sensor switching device 310. The controller 5a may output a selection signal representing information of the m-th vibrator selected as a vibration sensor, to the sensor switching device 310. Information of a vibrator may be an identification number of the vibrator. The identification number of a vibrator may be an integer from 1 to "m" given to each of the "m" pieces of vibrators.

The controller 5a determines and selects the n-th vibrator as a vibrator to be driven. When the controller 5a vibrates the n-th vibrator, the vibration is transmitted to the m-th vibrator used as a vibration sensor through a nozzle. As a result, the m-th vibrator generates an electromotive force representing the vibration state of the n-th vibrator. The vibration electromotive force measuring device 312 measures the electromotive force generated by the m-th vibrator. The vibration state of the n-th vibrator represents the vibration state of the nozzle at the time of vibrating the n-th vibrator. The nozzle is a tip portion of the nozzle member 266 including a nozzle hole 267.

The controller 5a determines whether or not the n-th vibrator is failed, based on the state of the electromotive force generated by the m-th vibrator measured by the vibration electromotive force measuring device 312. The controller 5a may regularly compare the voltage waveform of the electromotive force generated by the m-th vibrator used as a vibration sensor with the voltage waveform of the electromotive force generated by the m-th vibrator in the initial state of the driving vibrator.

The controller 5a may compare the voltage waveform of the measurement result with the reference voltage waveform, at each measurement timing of the electromotive force generated by the m-th vibrator.

As for the state of the electromotive force, a maximum value of the amplitude of the electromotive force may be used as an index. The controller 5a determines that the n-th vibrator is failed when the maximum value of the amplitude of the electromotive force generated by the m-th vibrator becomes minus 10 percent of the prescribed value or smaller. The prescribed value used for failure determination of the n-th vibrator may be a maximum value of the amplitude of the electromotive force generated by the m-th vibrator in the initial state of the n-th vibrator.

The initial state of the n-th vibrator may be a state immediately after the start of measuring vibration of the n-th vibrator. "Immediate after" in this context may include the timing of starting measurement or a period from the timing of starting measurement until the timing when a predetermined number of pulses are output. A prescribed value may be an average value of measurement values in a period from the timing of starting measurement until the timing when a predetermined number of pulses are output. The predetermined number of pulses may be at least one pulse. For example, the predetermined number of pulses may be 100 pulses.

A threshold of failure determination, that is, minus 10 percent of the prescribed value, is an example. A threshold of failure determination may be determined according to a condition that should be satisfied by the target 27 output from the target supply unit 26b. The shape of the target, presence or absence of satellites, or the like is applicable as a condition that should be satisfied by the target 27.

When the controller 5a determines that the n-th vibrator is failed, the controller 5a determines and selects the (n+1)-th vibrator as a vibrator to be driven. The (n+1)-th vibrator may be any vibrator if it is an unused one as a vibrator to be driven.

In the case where all of the vibrators other than the m-th vibrator used as a vibration sensor are failed, the controller 5a stops measurement of the electromotive force of the m-th vibrator by the vibration electromotive force measuring device 312.

The controller 5a determines and selects the m-th vibrator as a vibrator to be driven. The controller 5a regulates and determines the driving parameter of the m-th vibrator. The counter 314 measures the vibration number-of-times of the m-th vibrator. When the vibration number-of-times of the m-th vibrator measured by the counter 314 becomes a predetermined number of times or larger, the controller 5a stops vibration of the m-th vibrator. The vibration number-of-times of the m-th vibrator may be the vibration number-of-times after the m-th vibrator is used as a vibrator to be driven. The predetermined number of times is a prescribed value of the vibration number-of-times.

The predetermined number of times may be $1.0 \times 10^{11}$ times. $1.0 \times 10^{11}$ times correspond to the vibration number-of-times when a vibrator is driven at 100 kilohertz twelve days, 24 hours per day.

In the case where a timer is provided instead of the counter 314, the timer measures the period from the start of vibration of the m-th vibrator. The start of vibration may be the start of vibration when the m-th vibrator is used as a vibrator to be driven. When the period measured by the timer becomes a prescribed period or longer, the controller 5a stops vibration of the m-th vibrator. The prescribed period is a prescribed value of the vibration period.

The prescribed period may be 1,036,800 seconds. 1,036,800 seconds correspond to a period when a vibrator is driven twelve days, 24 hours per day.

Figure 10:
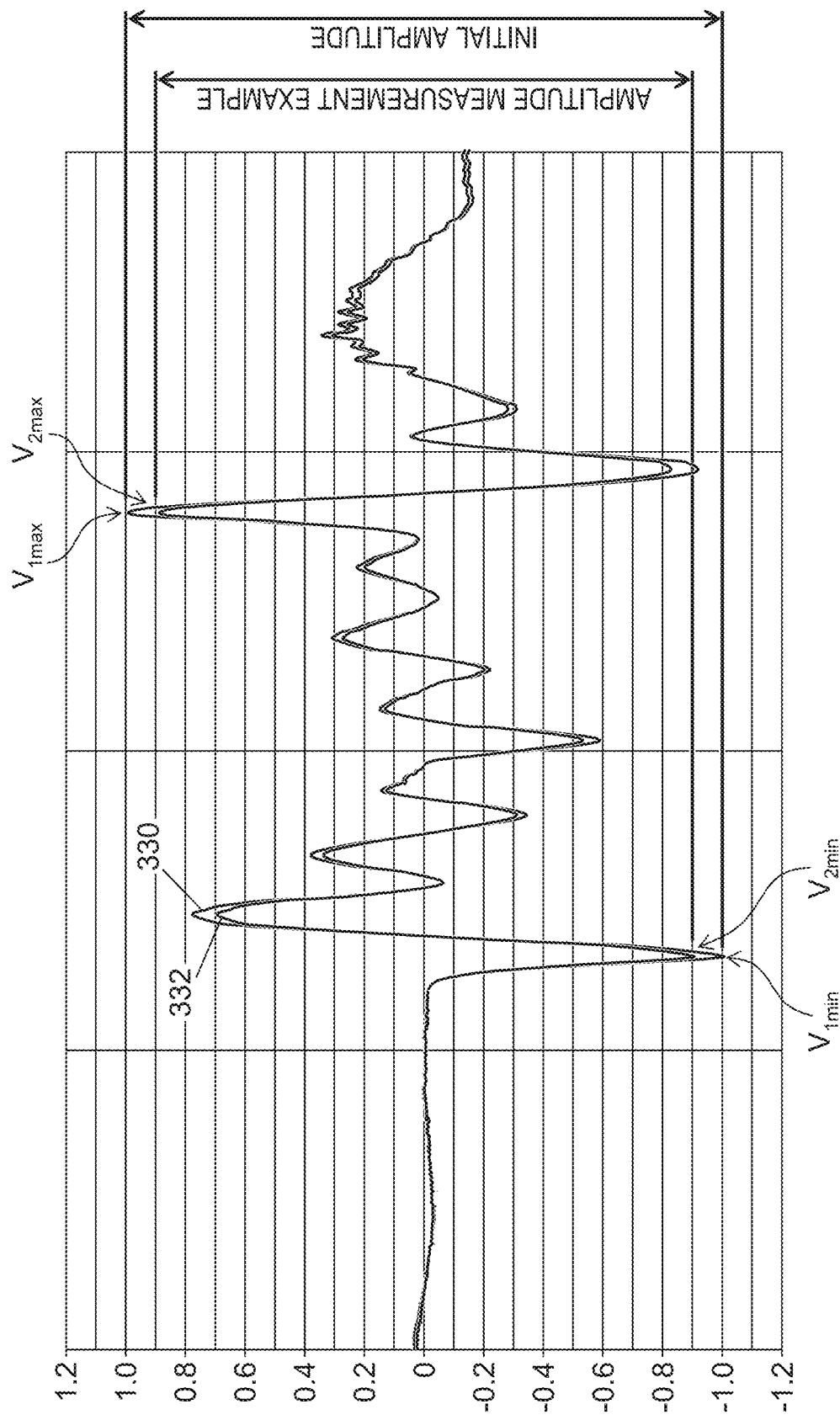
FIG. 10 is a diagram illustrating an example of a voltage waveform of an electromotive force generated by a vibrator used as a vibration sensor illustrated in FIG. 9.

FIG. 10 is a diagram illustrating an example of a voltage waveform of electromotive force generated by a vibrator used as the vibration sensor illustrated in FIG. 9. A voltage waveform denoted by a reference numeral 330 in FIG. 10 is an exemplary voltage waveform of electromotive force generated by a vibrator used as a vibration sensor, by the vibration of a vibrator to be driven in the initial state.

The voltage waveform denoted by a reference numeral 332 in FIG. 10 is an example of measurement of an amplitude of a voltage waveform. Specifically, it is an example of measurement of amplitude of a voltage waveform of electromotive force generated by a vibrator used as a vibration sensor, in the case where a driving vibrator is determined to be failed.

In FIG. 10, the horizontal axis of the graph shows the period. The unit of period is microseconds. The vertical axis of the graph illustrated in FIG. 10 shows voltage. The unit of voltage is volt. The vertical axis of FIG. 10 is shown using relative values in which a positive maximum value $V_{1max}$ in the voltage waveform 330 shows 1 volt and a negative minimum value $V_{1min}$ shows −1 volt.

A maximum value of the amplitude of the voltage waveform 330 calculated by subtracting the minimum value $V_{1min}$ from the maximum value $V_{1max}$ of the voltage waveform 330 may be set as a prescribed value of the electromotive force as an initial amplitude. It is also possible to set an average value of measurement values of 100 times as a prescribed value of the electromotive force, in which a maximum value of the amplitude of the voltage waveform 330 is taken as a measurement value of one time.

It is also possible to set a maximum value of the amplitude of the voltage waveform 332, calculated by subtracting a minimum value $V_{2min}$ from a maximum value $V_{2max}$ of the voltage waveform 332 to be a measurement value of the electromotive force. It is also possible to set an average value of measurement values of 100 times as a measurement value, in which a maximum value of the amplitude of the voltage waveform 332 is taken as a measurement value of one time.

A maximum value of the amplitude of the voltage waveform 330 that is a prescribed value of the electromotive force is 2.0 volts. A measurement value of the voltage waveform 332 is 1.8 volts, which is minus 10 percent of the prescribed value of the electromotive force or smaller. When the voltage waveform 332 is measured by the vibration electromotive force measuring device 312, the driving vibrator may be determined to be failed.

6.3 Procedure of Vibrator Switching Method

Figure 11:
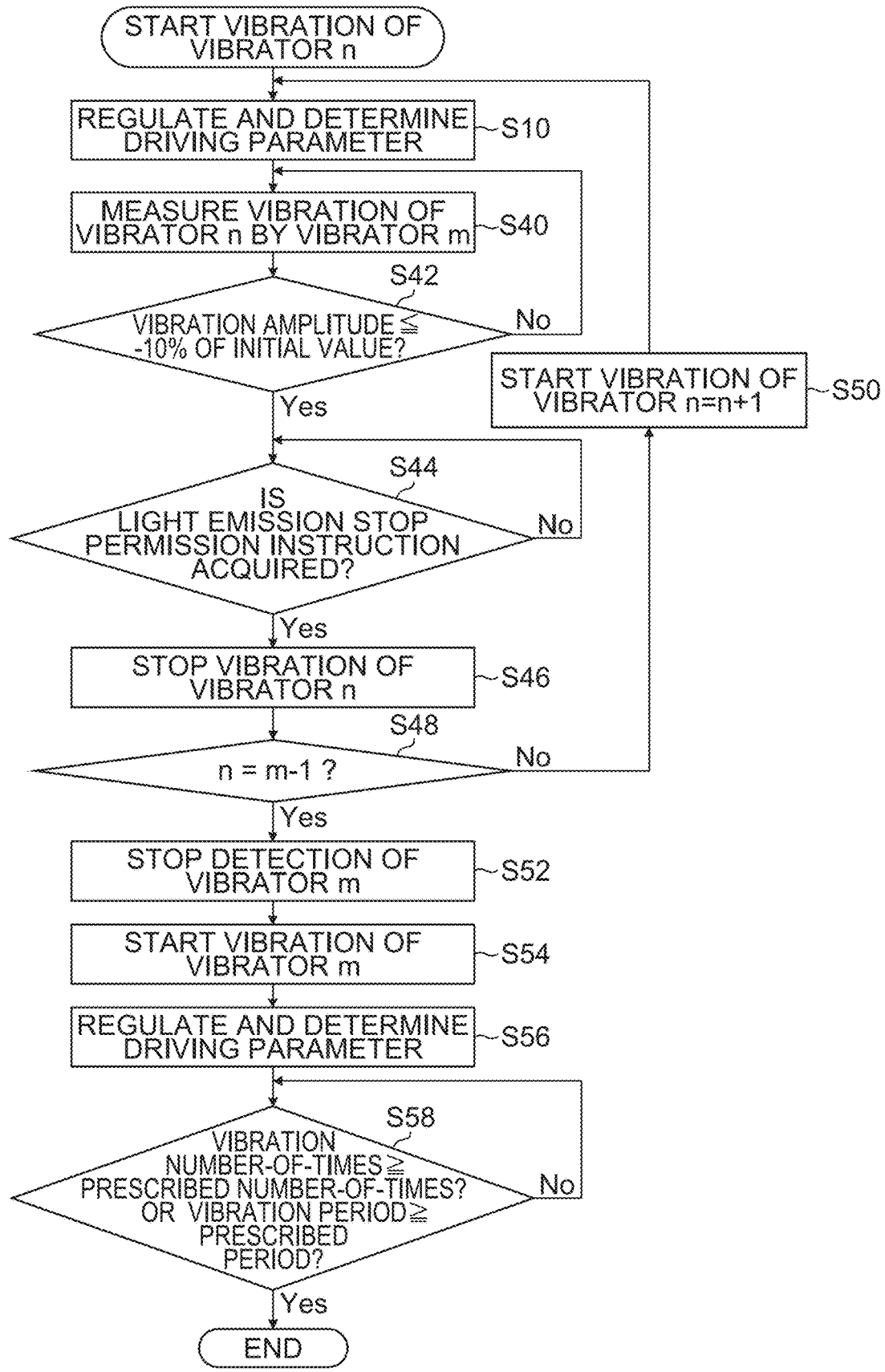
FIG. 11 is a flowchart illustrating a procedure of a vibrator switching method applied to the EUV light generation system according to the second embodiment.

FIG. 11 is a flowchart illustrating a procedure of a vibrator switching method applied to the EUV light generation system according to the second embodiment.

At step S10, the controller 5a illustrated in FIG. 9 regulates the driving parameter of the n-th vibrator to determine the driving parameter of the n-th vibrator. The controller 5a starts vibration of the n-th vibrator.

At step S40, the vibration electromotive force measuring device 312 illustrated in FIG. 9 measures vibration of the n-th vibrator detected by m-th vibrator. At step S42, the controller 5a determines whether or not the maximum value of the amplitude of the vibration of the n-th vibrator is minus 10 percent of the prescribed value or smaller.

At step S42, when the controller 5a determines that the amplitude of the vibration of the n-th vibrator exceeds minus 10 percent of the prescribed value, "No" determination is made. In the case of "No" determination, the controller 5a proceeds to step S40, and step S40 and step S42 are repeatedly executed until "Yes" determination is made at step S42.

At step S42, when the controller 5a determines that the amplitude of the vibration of the n-th vibrator is minus 10 percent of the prescribed value or smaller, "Yes" determination is made. In the case of "Yes" determination, the controller 5a proceeds to step S44.

The processes from step S44 to step S50 are respectively similar to the processes from step S16 to step S22 of FIG. 8, and the description thereof is omitted here. At step S48, when the controller 5a determines that the n-th vibrator is the (m−1)-th vibrator, the controller 5a proceeds to step S52.

In other words, at step S48, when the controller 5a determines that the m−1 pieces of vibrators are failed and that there is only the m-th vibrator used as a vibration sensor left as an unused vibrator as a driving vibrator, the controller 5a proceeds to step S52.

At step S52, the controller 5a stops detection by the m-th vibrator by the sensor switching device 310. At step S54, the controller 5a determines and selects the m-th vibrator as a vibrator to be driven, and starts vibration of the m-th vibrator.

At step S56, the controller 5a regulates and determines the driving parameter of the m-th vibrator. At step S58, the controller 5a measures the vibration number-of-times of the m-th vibrator by the counter 314. The controller 5a determines whether or not the vibration number-of-times of the m-th vibrator is the prescribed number-of-times or larger.

At step S58, the controller 5a may measure the vibration period of the m-th vibrator by the timer, and determine whether or not the vibration period of the m-th vibrator is the prescribed period or longer.

At step S58, when the controller 5a determines that the vibration number-of-times of the m-th vibrator is smaller than the prescribed number-of-times, "No" determination is made. In the case of "No" determination, at step S58, the controller 5a continues determination of whether or not the vibration number-of-times of the m-th vibrator is the prescribed number-of-times or larger until "Yes" determination is made.

At step S58, when the controller 5a determines that the vibration number-of-times of the m-th vibrator is the prescribed number-of-times or larger, "Yes" determination is made. In the case of "Yes" determination, the controller 5a ends switching of the vibrators.

6.4 Effect

Even if a vibrator driven for generating a target is failed, the failed vibrator is immediately switched to the other vibrator. Therefore, it is not necessary to replace the target supply unit when the vibrator fails. Thereby, the lifetime of the target supply unit can be extended by the number of pieces of the vibrators provided to the target supply unit.

Further, at least one of the vibrators is used as a vibration sensor. Therefore, a dedicated vibration sensor is not required.

The "m" pieces of vibrators including the first vibrator 111a, the second vibrator 111b, and the fourth vibrator 111d in the present disclosure are one aspect of a plurality of vibrators including a second vibrator that vibrates a nozzle and a third vibrator that detects vibration of a nozzle.

The m-th vibrator used as a vibration sensor in the present disclosure is one embodiment of a third vibrator. The m-th vibrator used as a vibration sensor in the present disclosure and the vibration electromotive force measuring device are aspects of detection units.

The sensor switching device 310 in the present disclosure is one aspect of a detection vibrator switch that switches any of a plurality of vibrators to the third vibrator. The counter 314 in the present disclosure is one aspect of a vibration number-of-times measuring unit that measures the vibration number-of-times of the second vibrator. The timer in the present disclosure is one aspect of a vibration period measuring unit that measures the vibration period of the second vibrator.

7. Third Embodiment 7.1 Configuration

Figure 12:
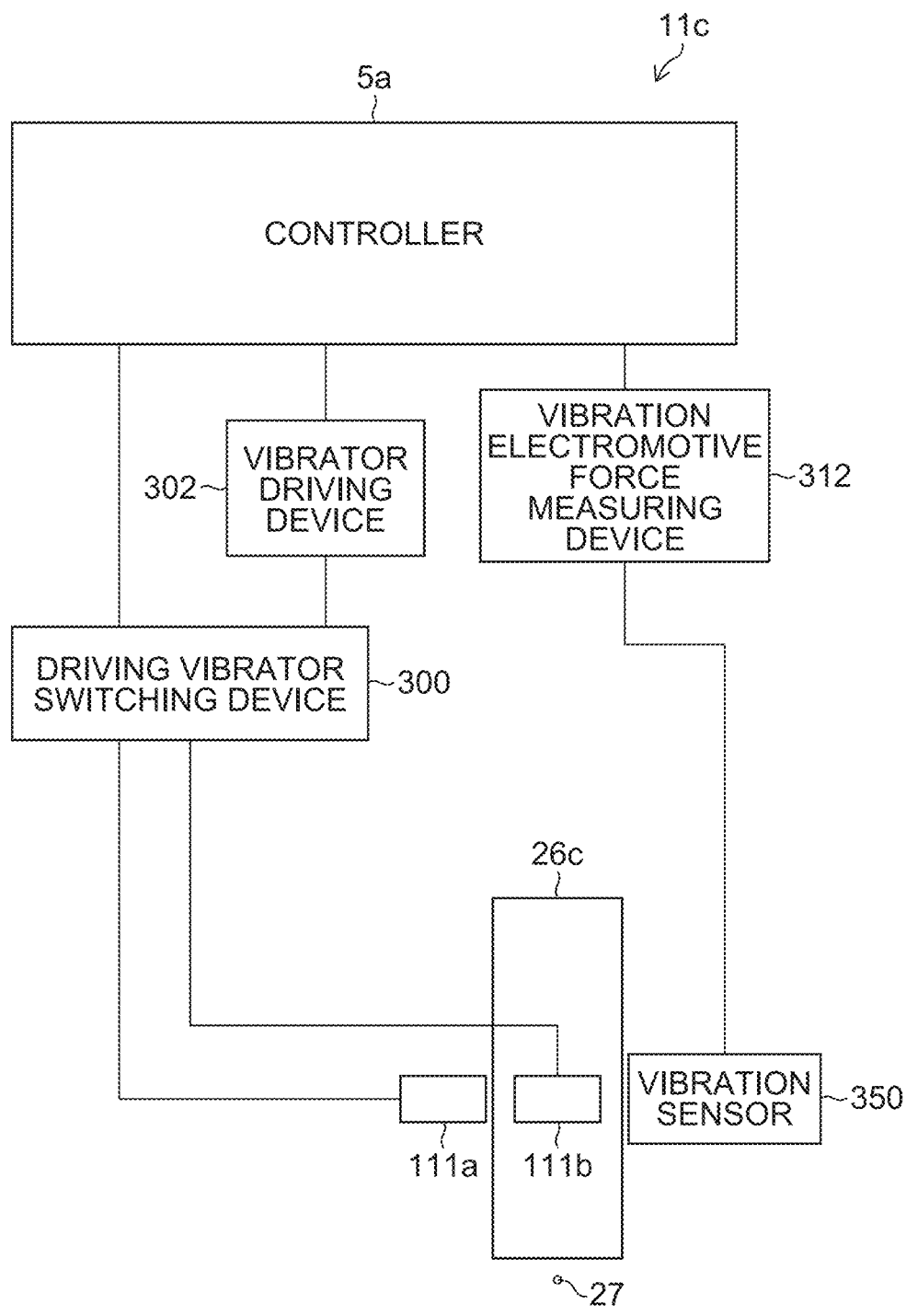
FIG. 12 is a block diagram schematically illustrating a configuration of an EUV light generation system according to a third embodiment.

FIG. 12 is a block diagram schematically illustrating a configuration of an EUV light generation system according to a third embodiment. A target supply unit 26c illustrated in FIG. 12 includes a dedicated vibration sensor 350. The vibration sensor 350 is connected with the vibration electromotive force measuring device 312 so as to be able to transmit an electric signal.

While the fourth vibrator 111d illustrated in FIG. 9 is used as a vibration sensor and a vibrator to be driven, the vibration sensor 350 illustrated in FIG. 12 is dedicated for detecting vibration. As the vibration sensor 350, a piezoelectric element may be used.

7.2 Operation

The controller 5a determines and selects a vibrator to be driven from among a plurality of vibrators. Here, the controller 5a selects the n-th vibrator. The controller 5a vibrates the n-th vibrator, and regulates and sets the driving parameter of the n-th vibrator.

The vibration electromotive force measuring device 312 measures vibration of the n-th vibrator detected by the vibration sensor 350. Measurement of vibration of the n-th vibrator detected by the vibration sensor 350 is similar to measurement of vibration of the n-th vibrator detected by the m-th vibrator used as a vibration sensor in the second embodiment, and the description thereof is omitted here.

7.3 Procedure of Vibrator Switching Method

Figure 13:
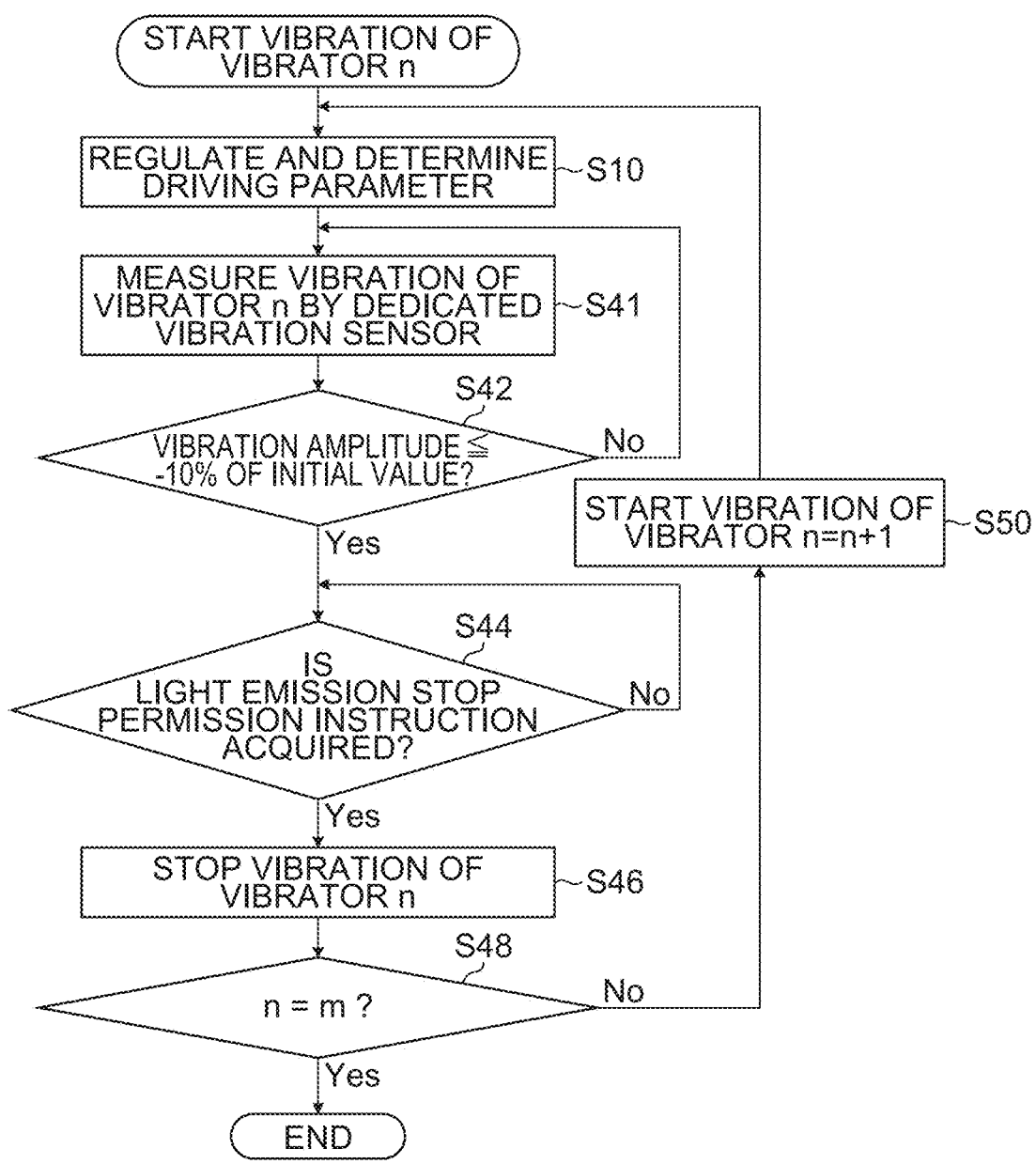
FIG. 13 is a flowchart illustrating a procedure of a vibrator switching method applied to the EUV light generation system according to the third embodiment.

FIG. 13 is a flowchart illustrating a procedure of a vibrator switching method applied to the EUV light generation system according to the third embodiment. In the flowchart illustrated in FIG. 13, step S41 is included instead of step S40 illustrated in FIG. 11.

At step S41, the vibration electromotive force measuring device 312 illustrated in FIG. 12 measures vibration of the n-th vibrator detected by the vibration sensor 350. The processes from step S42 to step S46 and step S50 of FIG. 13 are respectively similar to the processes from step S42 to step S46 and step S50 of FIG. 11, and the description thereof is omitted here.

Step S48 of FIG. 13 is similar to step S20 of FIG. 8. At step S48, the controller 5a illustrated in FIG. 12 determines whether or not the n-th vibrator is the last vibrator. The last vibrator is the m-th vibrator.

At step S48, when the controller 5a determines that the n-th vibrator is not the last vibrator. "No" determination is made. In the case of "No" determination, the controller 5a proceeds to step S50.

At step S48, when the controller 5a determines that the n-th vibrator is the last vibrator, "Yes" determination is made. In the case of "Yes" determination, the controller 5a illustrated in FIG. 12 ends switching of the vibrators.

7.4 Effect

Even if a vibrator used for generating a target is failed, the failed vibrator is immediately switched to the other vibrator. Therefore, it is not necessary to replace the target supply unit when the vibrator fails. Thereby, the lifetime of the target supply unit can be extended by the number of pieces of the vibrators provided to the target supply unit.

As a dedicated vibration sensor is provided, it is possible to employ a vibration sensor having characteristics advantageous for measuring vibration. This makes it possible to improve the accuracy of failure determination of a vibrator, and to perform more accurate determination on switching of vibrators. Therefore, reliability of the EUV light generation system is improved.

The "m" pieces of vibrators including the first vibrator 111a and the second vibrator 111b in the present disclosure are one aspect of a plurality of vibrators including a fourth vibrator. The configuration having the vibration sensor 350 and the vibration electromotive force measuring device 312 of the present disclosure is one aspect of a detection unit.

An unused vibrator among the "m" pieces of vibrators including the first vibrator 111a and the second vibrator 111b of the present disclosure is one aspect of the other vibrator different from the fourth vibrator.

8. Fourth Embodiment 8.1 Configuration

Figure 14:
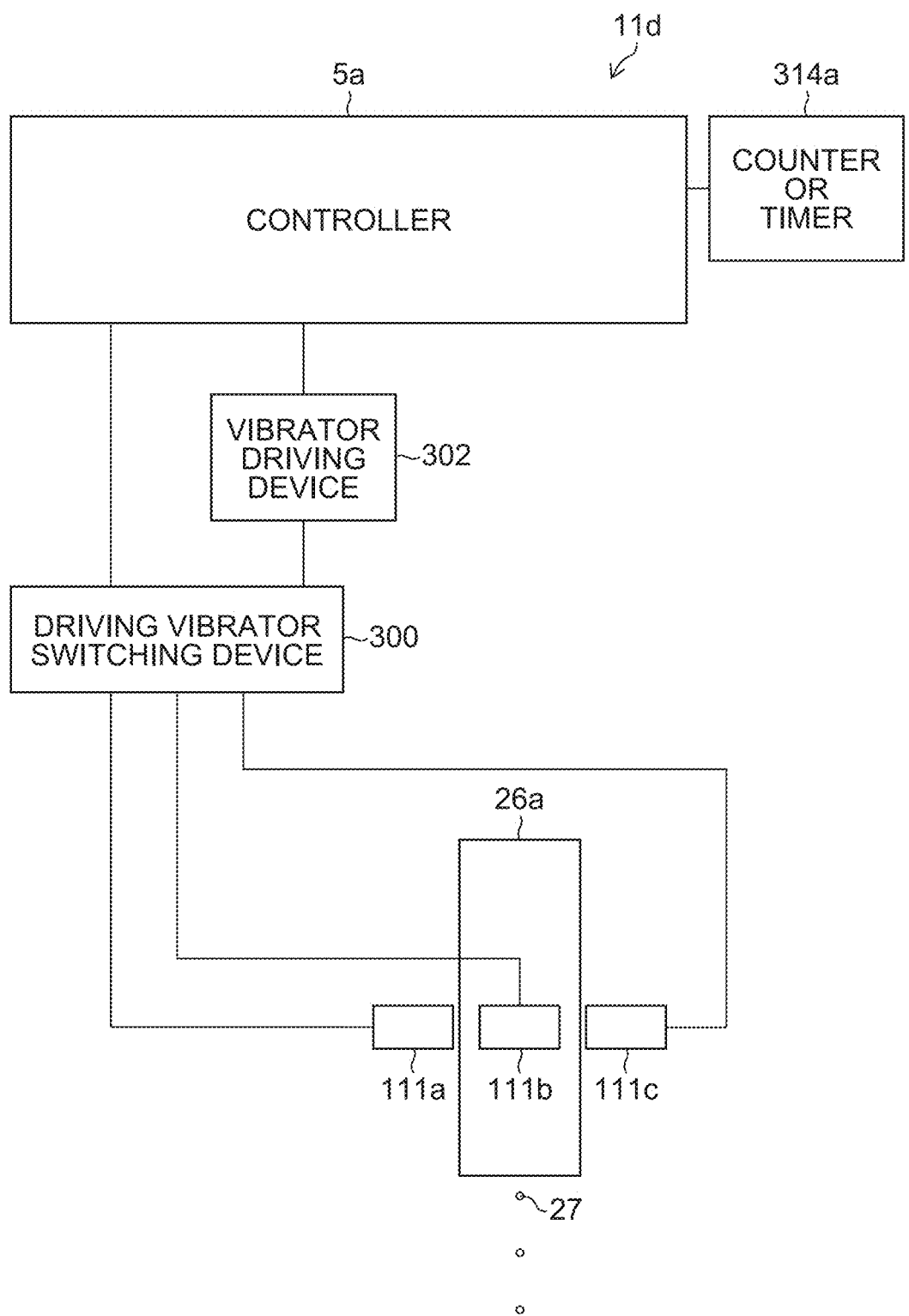
FIG. 14 is a block diagram schematically illustrating a configuration of an EUV light generation system according to a fourth embodiment.

FIG. 14 is a block diagram schematically illustrating a configuration of an EUV light generation system according to a fourth embodiment. The EUV light generation system 11d illustrated in FIG. 14 includes the target supply unit 26a illustrated in FIG. 7. On the other hand, the EUV light generation system 11d illustrated in FIG. 14 includes a counter 314a instead of the target detection device 304 illustrated in FIG. 7.

The counter 314a illustrated in FIG. 14 is connected with the controller 5a so as to be able to transmit an electric signal. The counter 314a measures the vibration number-of-times of the vibrator to be driven. The EUV light generation system 11d may have a timer instead of the counter 314a. The timer measures a vibration period of the vibrator to be driven.

8.2 Operation

The controller 5a determines and selects a vibrator to be driven from among a plurality of vibrators. Here, the controller 5a selects the n-th vibrator. The controller 5a vibrates the n-th vibrator, and regulates and sets the driving parameter of the n-th vibrator.

The controller 5a outputs an instruction to measure the vibration number-of-times during operation of the n-th vibrator, to the counter 314a. The target supply unit 26 may vibrate the n-th vibrator and output the target 27, during operation of the n-th vibrator.

The counter 314a measures the vibration number-of-times during operation of the n-th vibrator, until the vibration number-of-times during operation of the n-th vibrator reaches the prescribed number for one vibrator. When the vibration number-of-times during operation of the n-th vibrator reaches the prescribed number-of-times for one vibrator, the counter 314a outputs a signal indicating the fact to the controller 5a. For example, the prescribed number-of-times may be $1.0\times10^{11}$ times. $1.0\times10^{11}$ times correspond to the total vibration number-of-times of three vibrators where the lifetime of the target supply unit 26 is 36 days, the number of vibrators is three, each of the vibrators is vibrated at 100 kilohertz 12 days, 24 hours per day.

When a signal having been output from the counter 314a and indicating the fact that the vibration number-of-times during operation of the n-th vibrator reaches the prescribed number-of-times for one vibrator is input, the controller 5a outputs a signal of switching the driving vibrator to the other vibrator, to the driving vibrator switching device 300.

When the driving vibrator is switched to the other vibrator by the driving vibrator switching device 300, the controller 5a outputs a signal to reset the measurement value of the counter 314a to the counter 314a.

The counter 314a may output a signal representing the vibration number-of-times during operation of the n-th vibrator, to the controller 5a. The controller 5a may acquire a signal representing the measurement value of the counter 314a, until the vibration number-of-times during operation of the n-th vibrator reaches the prescribed number-of-times for one vibrator.

The controller 5a may monitor whether or not the vibration number-of-times during operation of the n-th vibrator reaches the prescribed number-of-times for one vibrator. When the vibration number-of-times during operation of the n-th vibrator reaches the prescribed number-of-times for one vibrator, the controller 5a may output a signal of switching the driving vibrator to the other vibrator, to the driving vibrator switching device 300 in accordance with a light emission stop permission instruction of the exposure device 6.

In the case where a timer is provided instead of the counter 314a, the controller 5a outputs an instruction to measure the vibration period during operation of the n-th vibrator to the timer. The timer measures the vibration period during operation of the n-th vibrator until the vibration period during operation of the n-th vibrator reaches the prescribed period.

When the vibration period during operation of the n-th vibrator reaches the prescribed period for one vibrator, the timer outputs a signal indicating the fact to the controller 5a. For example, the prescribed period may be 1,036,800 seconds. 1,036,800 seconds correspond to the total period of three vibrators where the lifetime of the target supply unit 26 is 36 days, the number of vibrators is three, and each of the vibrators is vibrated 12 days, 24 hours per day.

When a signal having been output from the timer and indicating the fact that the vibration period during operation of the n-th vibrator reaches the prescribed period for one vibrator, the controller 5a may output a signal of switching the driving vibrator to the other vibrator, to the driving vibrator switching device 300.

When the driving vibrator is switched to the other vibrator by the driving vibrator switching device 300, the controller 5a may output a signal to reset the measurement value of the timer to the counter 314a.

The timer may output a signal representing the vibration period during operation of the n-th vibrator, to the controller 5a. The controller 5a may acquire a signal representing the measurement value of the timer, until the vibration period during operation of the n-th vibrator reaches the prescribed period for one vibrator.

The controller 5a may monitor whether or not the vibration period during operation of the n-th vibrator reaches the prescribed period for one vibrator. When the vibration period during operation of the n-th vibrator reaches the prescribed period for one vibrator, the controller 5a may output a signal of switching the driving vibrator to the other vibrator, to the driving vibrator switching device 300.

8.3 Procedure of Vibrator Switching Method 8.3.1 First Example

Figure 15:
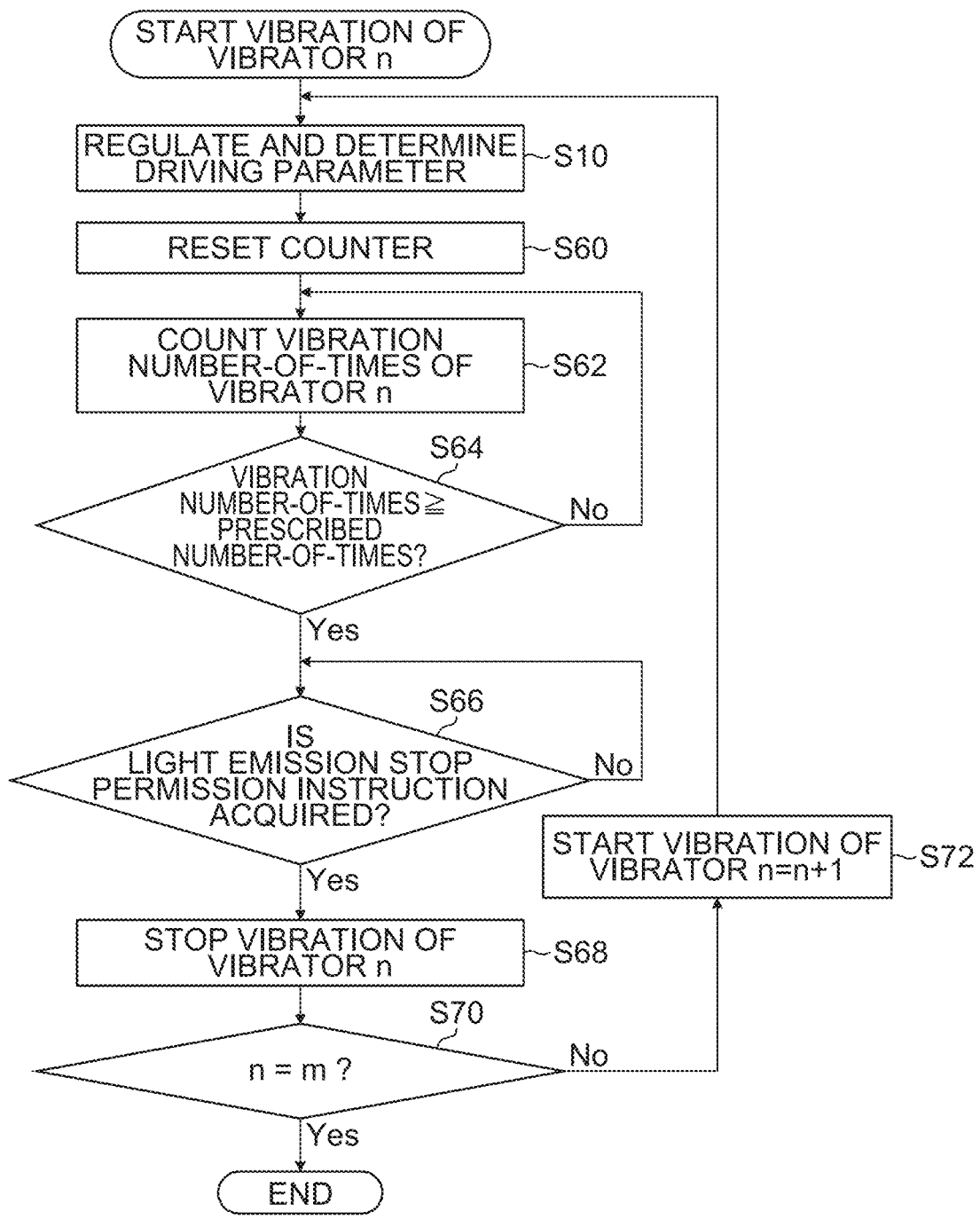
FIG. 15 is a flowchart illustrating a procedure of a first example of a vibrator switching method applied to the EUV light generation system according to the fourth embodiment.

FIG. 15 is a flowchart illustrating a procedure of a first example of a vibrator switching method applied to the EUV light generation system according to the fourth embodiment. The vibrator switching method according to the first example illustrated in FIG. 15 switches the vibrator to be driven based on the vibration number-of-times of the vibrator.

The controller 5a illustrated in FIG. 14 determines that the n-th vibrator, among the "m" pieces of vibrators provided to the target supply unit 26a, to be a vibrator to be driven, and starts vibration of the n-th vibrator.

At step S10 of FIG. 15, the controller 5a regulates the driving parameter of the n-th vibrator to determine the driving parameter of the n-th vibrator, and vibrates the n-th vibrator.

At step S60, the controller 5a outputs a signal for resetting the measurement value of the counter 314a, to the counter 314a. At step S62, the counter 314a illustrated in FIG. 14 measures the vibration number-of-times of the n-th vibrator. At step S64, the counter 314a determines whether or not the vibration number-of-times of the n-th vibrator reaches the prescribed number-of-times for one vibrator.

At step S64, when the counter 314a determines that the vibration number-of-times of the n-th vibrator does not reach the prescribed number-of-times for one vibrator, "No" determination is made. In the case of "No" determination, the controller 5a proceeds to step S62, and step S62 and step S64 are repeatedly executed until "Yes" determination is made at step S64.

At step S64, when the counter 314a determines that the vibration number-of-times of the n-th vibrator reaches the prescribed number-of-times for one vibrator, "Yes" determination is made. In the case of "Yes" determination, the controller 5a proceeds to step S66. The processes from step S66 to step S72 are respectively similar to the processes from step S16 to step S22 of FIG. 8, and the description thereof is omitted here.

At step S70, in the case of "Yes" determination, the controller 5a ends switching of the vibrators.

8.3.2 Second Example

Figure 16:
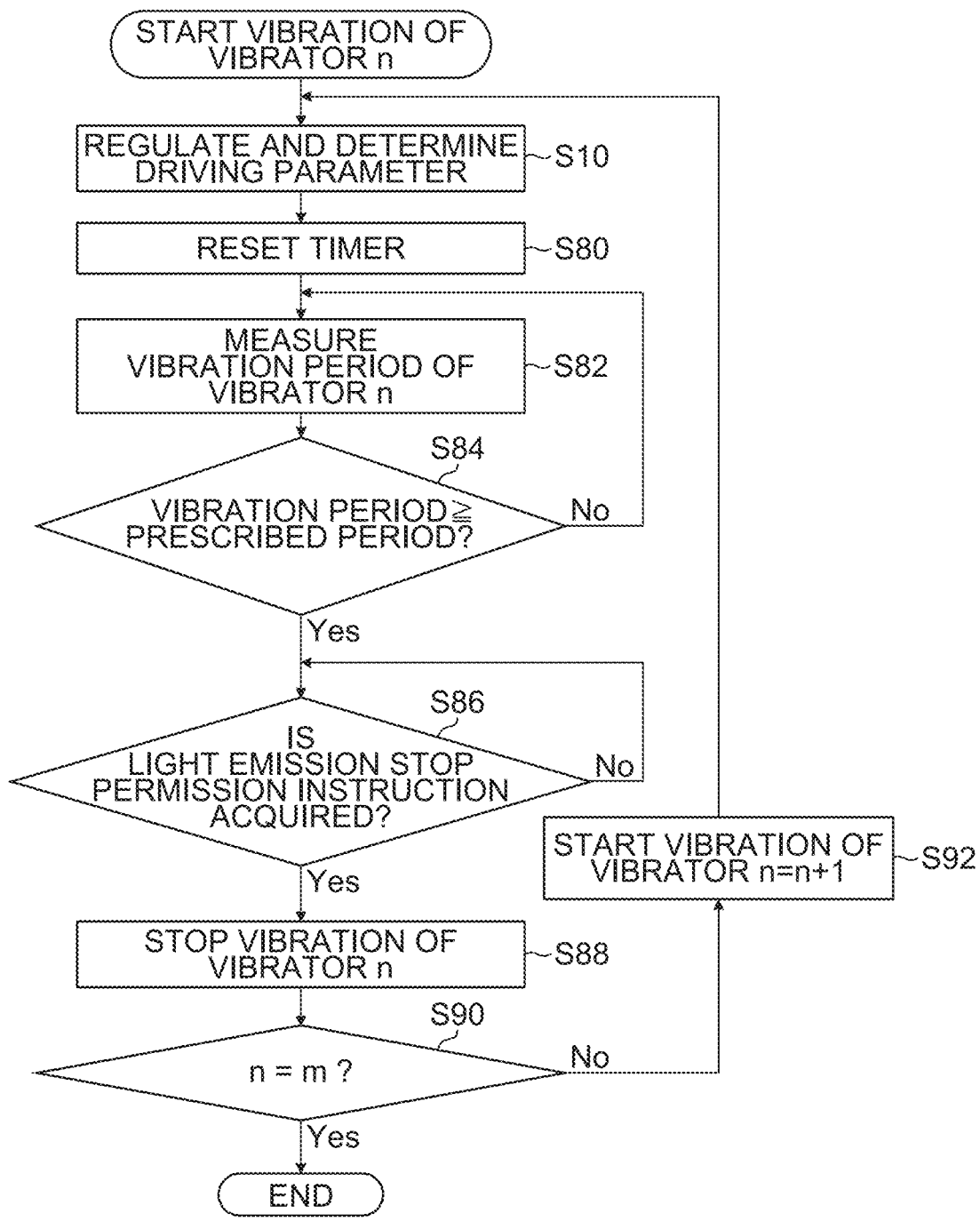
FIG. 16 is a flowchart illustrating a procedure of a second example of a vibrator switching method applied to the EUV light generation system according to the fourth embodiment.

FIG. 16 is a flowchart illustrating a procedure of a second example of a vibrator switching method applied to the EUV light generation system according to the fourth embodiment. In the vibrator switching method according to the second example illustrated in FIG. 16, the vibrator to be driven is switched based on the vibration period of the vibrator.

Step S10 of FIG. 16 is similar to step S10 of FIG. 15. Therefore, the description is omitted here. At step S80, the controller 5a. illustrated in FIG. 14 outputs a signal of resetting the measurement value of a timer not illustrated, to the timer.

At step S82, the timer measures the vibration period of the n-th vibrator. At step S84, the timer determines whether or not the vibration period of the n-th vibrator reaches the prescribed period for one vibrator.

At step S84, when the timer determines that the vibration period of the n-th vibrator does not reach the prescribed period for one vibrator, "No" determination is made. In the case of "No" determination, the controller 5a proceeds to step S82, and step S82 and step S84 are repeatedly executed until "Yes" determination is made at step S84.

At step S84, when the timer determines that the vibration period of the n-th vibrator reached the prescribed period for one vibrator, "Yes" determination is made. In the case of "Yes" determination, the controller 5a proceeds to step S86. The processes from step S86 to step S72 are respectively similar to the processes from step S16 to step S22 of FIG. 8, and the description thereof is omitted here.

At step S90, in the case of "Yes" determination, the controller 5a ends switching of the vibrators.

8.4 Effect

As compared with the case where the target supply unit includes one vibrator, it is possible to reduce the vibration number-of-times or vibration period per vibrator. As a result, it is possible to reduce the failure rate of a vibrator to be driven. Thereby, the lifetime of the target supply unit can be extended corresponding to the number of vibrators provided to the target supply unit.

Further, before the driving vibrator fails, it is possible to switch the driving vibrator to an unused vibrator, to thereby suppress the downtime in the EUV light generation system due to a failure of a vibrator. This improves the reliability of the EUV light generation system.

The "m" pieces of vibrators including the first vibrator 111a, the second vibrator 111b, and the third vibrator 111c in the present disclosure are one aspect of a plurality of vibrators including a fifth vibrator. The configuration having the counter 314a and the timer of the present disclosure is one aspect of a detection unit.

An unused vibrator among the "m" pieces of vibrators including the first vibrator 111a and the second vibrator 111b of the present disclosure is one aspect of a vibrator other than the fifth vibrator.

The counter 314a in the present disclosure is one aspect of a vibration number-of-times measuring unit that measures the vibration number-of-times of the fifth vibrator. The timer in the present disclosure is one aspect of a vibration period measuring unit that measures the vibration period of the fifth vibrator.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, the term "including" or "included" should be construed as "not limited to that described to be included". The term "have" should be construed as "not limited to that described to be held". Moreover, the indefinite article "a/an" described in the present description and in the accompanying claims should be construed to mean "at least one" or "one or more".

What is claimed is:

1. A target supply apparatus comprising:
a nozzle configured to output a target;
a plurality of vibrators including a first vibrator configured to vibrate the nozzle;
a detection unit configured to detect a change in state of the target having been output from the nozzle;
a vibrator switching unit configured to perform switching of a vibrator that vibrates the nozzle from the first vibrator to an other vibrator that is included in the vibrators and is different from the first vibrator; and
a control unit configured to control the switching of the vibrator that vibrates the nozzle, based on the change in state of the target having been output from the nozzle, detected by the detection unit.

2. The target supply apparatus according to claim 1, wherein
the detection unit includes a passage timing interval measuring unit configured to measure a passage timing interval between targets on a passage route of the targets having been output from the nozzle, and
when the passage timing interval between the targets measured by the passage timing interval measuring unit is equal to or smaller than a prescribed value that has been prescribed in advance, the control unit allows the vibrator switching unit to perform the switching of the vibrator that vibrates the nozzle from the first vibrator to the other vibrator different from the first vibrator.

3. The target supply apparatus according to claim 2, wherein
the passage timing interval measuring unit includes:
a first illumination unit configured to emit illumination light to the targets having been output from the nozzle; and
a light receiving unit provided at a position opposite to the first illumination unit across the passage route of the targets having been output from the nozzle.

4. The target supply apparatus according to claim 1, wherein
the detection unit includes an imaging unit configured to image the target having been output from the nozzle, and
when a passage timing interval between the targets obtained by analyzing images, imaged by the imaging unit, of the targets having been output from the nozzle is equal to or smaller than a prescribed value that has been prescribed in advance, the control unit allows the vibrator switching unit to perform switching of the vibrator that vibrates the nozzle from the first vibrator to the other vibrator that is different from the first vibrator.

5. The target supply apparatus according to claim 4, wherein
the detection unit includes a first illumination unit that is disposed at a position opposite to the imaging unit across the passage route of the target having been output from the nozzle.

6. The target supply apparatus according to claim 5, wherein
the imaging unit captures a still image of the target at a detection position of the target on the passage route of the target having been output from the nozzle.

7. The target supply apparatus according to claim 1, further comprising
a vibrator driving unit configured to supply a driving voltage to the vibrator that vibrates the nozzle, the vibrator driving unit being connected with the control unit so as to be able to receive an electric signal and connected with the vibrator switching unit so as to be able to transmit a driving voltage.

8. A target supply apparatus comprising:
a nozzle configured to output a target;
a plurality of vibrators including a first vibrator configured to vibrate the nozzle and a second vibrator configured to detect vibration of the nozzle;
a detection unit including the second vibrator, the detection unit being configured to output a detection signal representing the vibration of the nozzle;
a vibrator switching unit configured to perform switching of a vibrator that vibrates the nozzle from the first vibrator to an other vibrator that is included in the vibrators and is different from the first vibrator; and a control unit configured to control the switching of the vibrator that vibrates the nozzle, based on the detection signal output from the detection unit.

9. The target supply apparatus according to claim 8, wherein the detection unit outputs a detection signal representing a magnitude of the vibration of the nozzle, and when the magnitude of the vibration of the nozzle is equal to or smaller than a prescribed value that has been prescribed in advance, the control unit performs switching of the vibrator that vibrates the nozzle from the first vibrator to the other vibrator that is different from the first vibrator.

10. The target supply apparatus according to claim 8, further comprising a detection vibrator switching unit configured to switch any of the plurality of vibrators to the second vibrator, wherein the control unit allows the detection vibrator switching unit to perform switching of the other vibrator that is different from the first vibrator that vibrates the nozzle to the second vibrator.

11. The target supply apparatus according to claim 8, wherein the control unit allows the vibration switching unit to switch the second vibrator that detects vibration of the nozzle to the first vibrator that vibrates the nozzle.

12. The target supply apparatus according to claim 11, further comprising a vibration number-of-times measuring unit configured to measure a vibration number-of-times of the first vibrator when a vibrator, that has been the second vibrator, is switched to the first vibrator, wherein the control unit stops vibration of the first vibrator when a measurement value measured by the vibration number-of-times measuring unit reaches a prescribed value of the vibration number-of-times that has been prescribed in advance.

13. The target supply apparatus according to claim 11, further comprising a vibration period measuring unit configured to measure a vibration period of the first vibrator when a vibrator, that has been the second vibrator, is switched to the first vibrator, wherein when a measurement value measured by the vibration period measuring unit reaches a prescribed value of the vibration period that has been prescribed in advance, the control unit stops vibration of the first vibrator.

14. The target supply apparatus according to claim 8, further comprising a vibrator driving unit configured to supply a driving voltage to the vibrator that vibrates the nozzle, the vibrator driving unit being connected with the control unit so as to be able to receive an electric signal and being connected with the vibrator switching unit so as to be able to transmit a driving voltage.

15. A target supply apparatus comprising:

a nozzle configured to output a target;

a plurality of vibrators including a first vibrator configured to vibrate the nozzle;

a detection unit configured to detect vibration of the nozzle and output a detection signal representing vibration of the nozzle;

a vibrator switching unit configured to perform switching of a vibrator that vibrates the nozzle from the first vibrator to an other vibrator that is included in the vibrators and is different from the first vibrator; and a control unit configured to control the switching of the vibrator that vibrates the nozzle, based on the detection signal output from the detection unit.

16. The target supply apparatus according to claim 15, wherein the detection unit outputs a direction signal representing magnitude of the vibration of the nozzle, and when the magnitude of the vibration of the nozzle is equal to or smaller than a prescribed value that has been prescribed in advance, the control unit switches the vibrator that vibrates the nozzle from the first vibrator to the other vibrator that is different from the first vibrator.

17. The target supply apparatus according to claim 15, further comprising a vibrator driving unit configured to supply a driving voltage to the vibrator that vibrates the nozzle, the vibrator driving unit being connected with the control unit so as to be able to receive an electric signal and being connected with the vibrator switching unit so as to be able to transmit a driving voltage.

18. A target supply apparatus comprising:

a nozzle configured to output a target;

a plurality of vibrators including a first vibrator configured to vibrate the nozzle;

a detection unit including at least one of a vibration number-of-times measuring unit configured to measure a vibration number-of-times of the first vibrator and a vibration period measuring unit configured to measure a vibration period of the first vibrator;

a vibrator switching unit configured to perform switching of a vibrator that vibrates the nozzle from the first vibrator to an other vibrator that is included in the vibrators and is different from the first vibrator; and a control unit configured to allow the vibration switching unit to perform the switching of the vibrator that vibrates the nozzle to the other vibrator different from the first vibrator, when the vibration number-of-times of the first vibrator measured by the vibration number-of-times measuring unit reaches a prescribed value of the vibration number-of-times that has been prescribed in advance, or when the vibration period of the first vibrator measured by the vibration period measuring unit reaches a prescribed value of the vibration period that has been prescribed in advance.

19. The target supply apparatus according to claim 18, further comprising a vibrator driving unit configured to supply a driving voltage to the vibrator that vibrates the nozzle, the vibrator driving unit being connected with the control unit so as to be able to receive an electric signal and being connected with the vibrator switching unit so as to be able to transmit a driving voltage.

\* \* \* \* \*